US012763730B2

(12) United States Patent
Wang et al.

(10) Patent No.: US 12,763,730 B2
(45) Date of Patent: Oct. 13, 2026

(54) MULTIPLE-STAGE MULTIPLE-PATH POWER AMPLIFIER WITH IN-PACKAGE AMPLIFIER DIES AND EXTERNAL INTER-STAGE POWER SPLITTER

(71) Applicant: NXP USA, Inc., Austin, TX (US)

(72) Inventors: Lu Wang, Chandler, AZ (US); Xin Fu, Chandler, AZ (US); Lu Li, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 434 days.

(21) Appl. No.: 18/389,831

(22) Filed: Dec. 20, 2023

(65) Prior Publication Data

US 2025/0211170 A1 Jun. 26, 2025

(51) Int. Cl.

| | |
|---|---|
| ***H03F 1/02*** | (2006.01) |
| ***H03F 1/56*** | (2006.01) |
| ***H03F 3/195*** | (2006.01) |
| ***H03F 3/24*** | (2006.01) |
| ***H10W 40/22*** | (2026.01) |
| ***H10W 44/20*** | (2026.01) |

(52) U.S. Cl.

CPC ........... *H03F 1/0288* (2013.01); *H03F 1/565* (2013.01); *H03F 3/195* (2013.01); *H03F 3/245* (2013.01); *H10W 40/22* (2026.01); *H10W 44/20* (2026.01); *H03F 2200/423* (2013.01); *H03F 2200/451* (2013.01); *H10W 44/206* (2026.01); *H10W 44/234* (2026.01)

(58) Field of Classification Search

CPC ........ H03F 1/0288; H03F 1/565; H03F 3/195; H03F 3/245; H03F 2200/423; H03F 2200/451; H10W 40/22; H10W 44/20; H10W 44/206; H10W 44/234; H10W 44/501

USPC .............................................. 330/124 R, 295

See application file for complete search history.

(56) References Cited

U.S. PATENT DOCUMENTS

| | | | | |
|---|---|---|---|---|
| 10,284,147 | B2 * | 5/2019 | Wu | H03F 1/0288 |
| 11,050,388 | B2 * | 6/2021 | Wang | H03F 1/0288 |
| 11,145,609 | B2 | 10/2021 | Schultz et al. | |
| 11,342,275 | B2 | 5/2022 | Wei et al. | |
| 12,184,237 | B2 * | 12/2024 | Li | H03F 1/0288 |

(Continued)

OTHER PUBLICATIONS

U.S. Appl. No. 18/062,087, filed Dec. 6, 2022; not yet published; 45 pages.

*Primary Examiner* — Khanh V Nguyen

(74) *Attorney, Agent, or Firm* — Sherry W. Gourlay

(57) ABSTRACT

A packaged semiconductor device includes a substrate, an interface for signal communication with an external power splitter, and a first and second stages of a multiple-stage amplifier. The interface includes first, second, and third leads coupled to the substrate. The first amplifier stage includes a first amplifier die with a first input, a first output, and a first power transistor that functions as a driver amplifier. The second amplifier stage includes first and second amplifier paths. The first amplifier path has a second amplifier die with a second input, a second output, and a second transistor that functions as a first final stage amplifier. The second amplifier path has a third amplifier die with a third input, a third output, and a third transistor that functions as a second final stage amplifier. The first output, second input, and third input are coupled to the first, second, and third leads, respectively.

19 Claims, 8 Drawing Sheets

(56) References Cited

U.S. PATENT DOCUMENTS

| | | | | |
|---|---|---|---|---|
| 2014/0055195 | A1* | 2/2014 | Engala | H03F 1/3241 330/124 R |
| 2018/0013391 | A1* | 1/2018 | Maalouf | H03F 1/0288 |
| 2021/0152130 | A1 | 5/2021 | Srinidhi Embar et al. | |
| 2021/0328552 | A1 | 10/2021 | Tucker et al. | |
| 2023/0050988 | A1 | 2/2023 | Hua et al. | |
| 2024/0186212 | A1* | 6/2024 | Hiemstra | H10W 40/22 |

* cited by examiner

MULTIPLE-STAGE MULTIPLE-PATH POWER AMPLIFIER WITH IN-PACKAGE AMPLIFIER DIES AND EXTERNAL INTER-STAGE POWER SPLITTER

TECHNICAL FIELD

Embodiments of the subject matter described herein relate generally to radio frequency (RF) amplifiers, and more particularly to multiple-path amplifiers (e.g., Doherty amplifiers) and amplifier modules.

BACKGROUND

The Doherty power amplifier is ubiquitous within cellular base station transmitters because the Doherty power amplifier architecture is known to improve back-off efficiency for spectrally efficient modulations, when compared with other types of amplifiers. The high efficiency of the Doherty power amplifier makes the architecture desirable for current and next-generation wireless systems. However, the trends toward higher and higher operational frequencies (e.g., in the gigahertz (GHz) range) and increased system miniaturization presents challenges to conventional Doherty power amplifier architectures, particularly in the area of semiconductor package design. As frequencies continue to increase, effective Doherty power amplifier implementations are needed that enable high efficiency operation in low cost and small footprint solutions.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
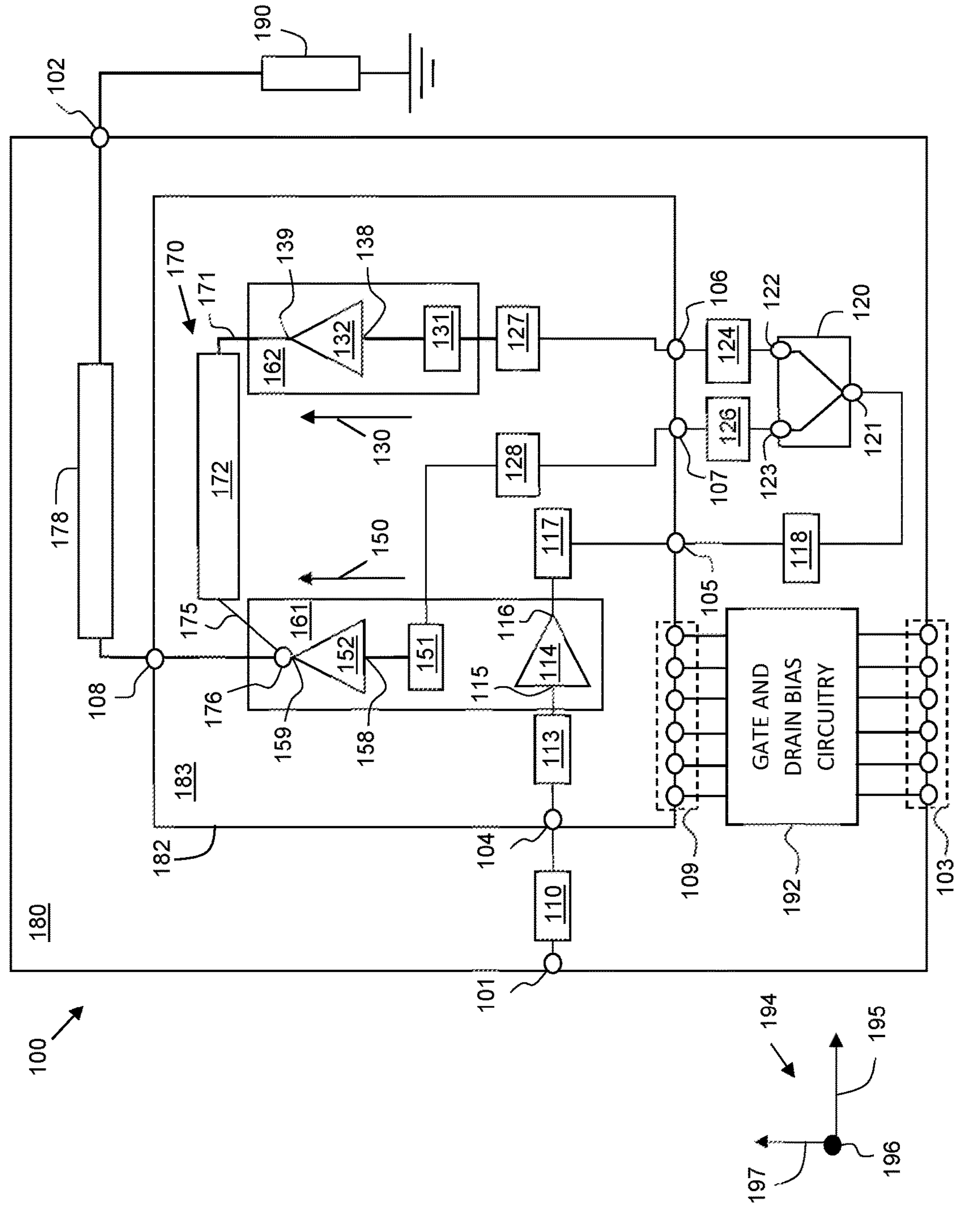
FIG. 1 is a schematic diagram of a Doherty power amplifier, in accordance with an example embodiment.

Embodiments of the inventive subject matter described herein include multiple-stage, multiple-path power amplifiers (e.g., including but not limited to Doherty amplifiers), which are configured to amplify radio frequency (RF) signals. According to one or more embodiments, a multiple-stage, multiple-path power amplifier includes an amplifier substrate and a packaged power amplifier device (or more generally, a "packaged semiconductor device") coupled to a top surface of the amplifier substrate. The packaged power amplifier device includes a first amplifier die (e.g., a driver amplifier die) corresponding to a first amplification stage (e.g., a driver stage), and a set of second amplifier dies (e.g., carrier and peaking amplifier dies) that together correspond to a second amplification stage. The packaged power amplifier device also includes an interface for signal communication with an external power splitter that is coupled to the top surface of the amplifier substrate. More specifically, the package interface includes a plurality of leads, where a first one of these leads is coupled to the output of the first amplifier die (e.g., the output of the driver amplifier die). Second and third ones of these leads are coupled to the inputs to the second amplifier dies (e.g., the inputs of the carrier and peaking dies). On the amplifier substrate, an input of the power splitter is coupled to the first lead, and outputs of the power splitter are coupled to the second and third leads, respectively.

Accordingly, the arrangement may provide a power amplifier lineup with an in-package driver amplifier that provides a pre-amplified signal through the first lead to the splitter input. The splitter divides the power of the pre-amplified signal into first and second signals (e.g., carrier and peaking signals), and provides those signals through the second and third leads to the in-package carrier and peaking amplifiers. Accordingly, the power amplifier lineup is "partially integrated" in that the first and second amplification stages (or the driver, carrier, and peaking dies) all are integrated within a single packaged semiconductor device, while the interstage power splitter is located outside of the packaged semiconductor device and accessed through leads of the packaged semiconductor device. In some embodiments, an output transformer at the output of the amplifier also may be located outside of the packaged semiconductor device on the amplifier substrate.

This arrangement enables the size of a packaged power amplifier device to be reduced (e.g., by about 30 percent, more or less) when compared with a power amplifier in which the power splitter and/or the output transformer are integrated within the power amplifier package with the driver, carrier, and peaking amplifier dies. By moving the power splitter and/or the output transformer outside of the power amplifier package, the cost of the packaged power amplifier device also is reduced.

The multiple-stage power amplifier embodiments described herein may be utilized to implement any of a variety of different types of power amplifiers. To provide concrete examples that will help to convey the details of the inventive subject matter, two examples of Doherty power amplifiers are described herein. Each Doherty amplifier embodiment includes an in-package driver amplifier stage, which is coupled through an external power splitter to in-package final carrier and peaking amplifier stages. However, those of skill in the art will understand, based on the description herein, that the inventive subject matter may be utilized in systems that implement other types of multiple-stage amplifiers, as well. Accordingly, the use of Doherty power amplifiers in the example embodiments below is not meant to limit application of the inventive subject matter only to Doherty power amplifiers, as the inventive subject matter may be used in other types of multiple-stage power amplifiers, as well.

Figure 2:
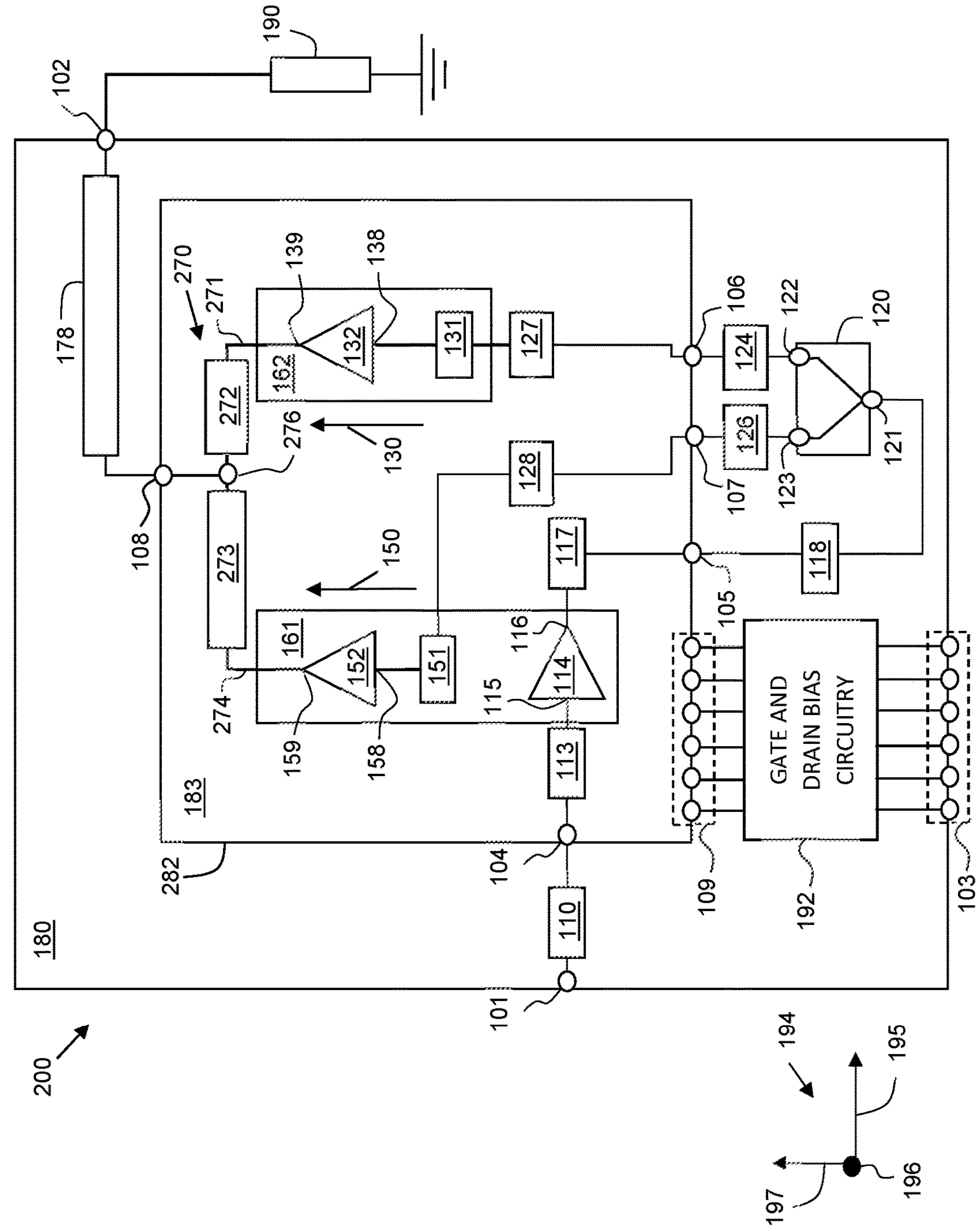
FIG. 2 is a schematic diagram of a Doherty power amplifier, in accordance with another example embodiment.

Prior to describing various physical implementations of power amplifiers, reference is made to FIGS. 1 and 2, which are schematic diagrams of first and second example embodiments of Doherty power amplifiers 100, 200. Except for the output combining networks 170 (FIG. 1) and 270 (FIG. 2), Doherty power amplifiers 100 and 200 are substantially similar. To enable a concise description, the same reference numbers are used for substantially identical elements in FIGS. 1 and 2. Differences between the embodiments shown in FIGS. 1 and 2 are indicated with different reference numbers, and these differences are explained in detail below. To better describe the relative orientations of various elements of the illustrated embodiments, Cartesian coordinate systems 194 with orthogonal axes 195, 196, 197 are depicted in the lower right corners of FIGS. 1 and 2, and also in other Figures.

Figure 6:
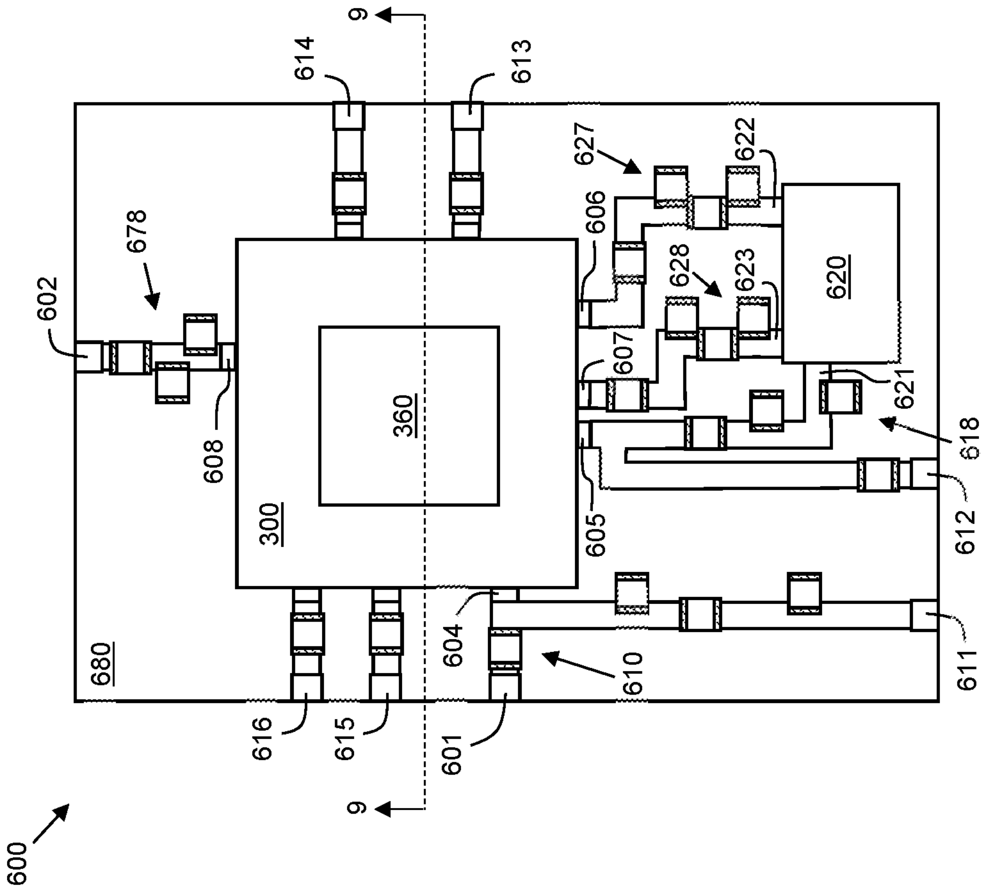
FIG. 6 is a top view of a power amplifier system with the power amplifier device of FIG. 3 mounted on an amplifier substrate that includes a power splitter and other amplifier features, in accordance with an example embodiment.

Power amplifiers 100, 200 each essentially include a multiple-stage Doherty amplifier implemented on an amplifier substrate 180 (e.g., amplifier substrate 680, FIG. 6). The Doherty amplifiers 100, 200 are "multiple-stage, multiple-path" amplifiers in that each amplifier 100, 200 includes a driver stage (e.g., implemented with driver amplifier 114) and parallel-coupled final stages (e.g., implemented with carrier and peaking amplifiers 132, 152).

As will be discussed in more detail later, each Doherty amplifier 100, 200 includes circuitry disposed on an amplifier substrate 180 or disposed within a packaged power amplifier device 182, 282. Importantly, according to one or more embodiments, the amplification components (e.g., driver, carrier, and peaking dies 114, 132, 152) of the Doherty amplifier 100, 200 are included within the packaged power amplifier device 182, 282, while an interstage power splitter 120 is disposed on the amplifier substrate 180. As will be explained in more detail later, the external, interstage power splitter 120 is electrically coupled to the amplification components through an interface for signal communication that includes a plurality of device terminals (e.g., device terminals 104-108, 302, 304-308, FIGS. 1-3).

The amplifier substrate 180 may include, for example, a printed circuit board (PCB) or other suitable substrate. The packaged power amplifier device 182, 282 may be a discrete, surface-mountable device that is configured to be coupled to a mounting surface of the amplifier substrate 180. More particularly, distal ends of conductive device leads 104-109 (e.g., leads 302, 304-312, FIG. 3) of the packaged power amplifier device 182, 282 are physically and electrically coupled to conductive bond pads (e.g., bond pads 604-608, FIG. 6) at the mounting surface of the amplifier substrate 180. As will be discussed in more detail later, the packaged power amplifier device 182, 282 includes a device substrate 183 (e.g., device substrate 383, FIGS. 3-5), the above-mentioned device leads 104-109 (e.g., leads 302, 304-312, FIGS. 3-5), one or more heat dissipation structures 161, 162 (e.g., structures 361, 362, FIGS. 3-5), a plurality of power amplifier dies 114, 132, 152 (e.g., dies 314, 332, 352, FIGS. 3-5) coupled to the heat dissipation structures 161, 162, and additional circuitry as described below.

Each Doherty amplifier 100, 200 includes an amplifier input terminal 101 on the amplifier substrate 180, an amplifier output terminal 102 on the amplifier substrate 180, a driver amplifier that includes a driver amplifier die 114 (e.g., die 314, FIG. 3) in the packaged power amplifier device 182, 282, a power splitter 120 on the amplifier substrate 180, a carrier amplifier path 130 that includes a carrier amplifier die 132 (e.g., die 332, FIG. 3) in the packaged power amplifier device 182, 282, a peaking amplifier path 150 that includes a peaking amplifier die 152 (e.g., die 352, FIG. 3) in the packaged power amplifier device 182, 282, an output combining network 170 or 270 in the packaged power amplifier device 182, 282, a combining node 176 or 276 in the packaged power amplifier device 182, 282, and an output impedance transformer 178 on the amplifier substrate 180, in an embodiment. A notable difference between Doherty amplifiers 100, 200 and conventional Doherty amplifiers is that, in Doherty amplifiers 100, 200, the driver, carrier, and peaking amplifier dies 114, 132, 152 are implemented within the packaged power amplifier device 182, 282, while the power splitter 120 is implemented outside of the packaged power amplifier device 182, 282 on the amplifier substrate 180. By pulling the power splitter 120 out of the packaged power amplifier device 182, 282, the packaged power amplifier device 182, 282 may be made smaller in size, when compared to conventional Doherty amplifier devices.

When incorporated into a larger RF system, the amplifier input terminal 101 is coupled to an RF signal source, and the amplifier output terminal 102 is coupled to a load 190 (e.g., an antenna or other load). The RF signal source provides an input RF signal, which is an analog signal that includes spectral energy that typically is centered around one or more carrier frequencies. Fundamentally, the Doherty amplifier is configured to amplify the input RF signal received at the amplifier input terminal 101, and to produce an amplified output RF signal at the amplifier output terminal 102.

According to an embodiment, the input RF signal received at the amplifier input terminal 101 is conveyed through a first impedance matching circuit 110 on the amplifier substrate 180 to a device input lead 104 of the packaged power amplifier device 182, 282. The input RF signal is then amplified through a driver amplifier within the packaged power amplifier device 182, 282. The driver amplifier corresponds to a first amplifier stage of the Doherty amplifier 100, 200.

The driver amplifier includes a driver input impedance matching circuit 113, the driver amplifier die 114, and a driver output impedance matching circuit 117. The driver input impedance matching circuit 113 is coupled to the device substrate 183 between the device input lead 104 and an input terminal 115 (e.g., gate terminal) of the driver amplifier die 114. Together, the first impedance matching circuit 110, a small inductance provided by the device input lead 104, and the driver input impedance matching circuit 113 (collectively considered to be a "driver input impedance matching circuit") are configured to transform the gate impedance of the power transistor within die 114 to a more desirable system level impedance (e.g., 50 ohms).

According to one or more embodiments, the driver amplifier die 114 is coupled to a first heat dissipation structure 161 (e.g., heat dissipation structure 361, FIGS. 3-5), which is configured to convey heat produced by the driver amplifier die 114 to a system heat sink (e.g. heat sink 916 or 1016, FIGS. 9, 10) during operation of the Doherty amplifier 100, 200. The driver amplifier die 114 is configured to amplify the input RF signal received from the input impedance matching circuit 113 in order to produce a pre-amplified RF signal at an output terminal 116 (e.g., drain terminal) of the driver amplifier die 114. According to one or more embodiments, the pre-amplified RF signal is then conveyed through the driver output impedance matching circuit 117 to a driver output lead 105 of the packaged power amplifier device 182, 282.

Now back on the amplifier substrate 180, the pre-amplified RF signal is conveyed through an additional impedance matching circuit 118 on the amplifier substrate 180 to an input 121 of the power splitter 120. The power splitter 120 is configured to divide the pre-amplified RF signal received at input 121 into first and second pre-amplified RF signals (or carrier and peaking signals), which are provided at power splitter outputs 122, 123, respectively. According to an embodiment, the power splitter 120 is configured to impart a phase difference (e.g., about a 90 degree phase difference) between the first and second pre-amplified RF signals. In such an embodiment, at outputs 122 and 123, the carrier and peaking signals may be about 90 degrees out of phase from each other.

When Doherty amplifier has a symmetrical configuration (i.e., a configuration in which the power transistors in dies 132, 152 are substantially identical in size), the power splitter 120 may divide or split the input RF signal received at the input 121 into two signals that are very similar with, in some embodiments, equal power. Conversely, when Doherty amplifier has an asymmetrical configuration (i.e., a configuration in which one of the power transistors, typically the power transistor in the peaking amplifier die 152, is significantly larger), the power splitter 120 may output carrier and peaking signals having unequal power.

The outputs 122, 123 of the power splitter 120 are connected through phase shifting circuits 124, 126 on the amplifier substrate 180 to a carrier input lead 106 and a peaking input lead 107 of the packaged power amplifier device 182, 282. Now back within the packaged power amplifier device 182, 282, the carrier input lead 106 is coupled to the carrier amplifier path 130, and the peaking input lead 107 is coupled to the peaking amplifier path 150. As will be described in more detail below, the carrier amplifier path 130 is configured to amplify the pre-amplified carrier signal from the power splitter 120, resulting in an amplified carrier signal. Similarly, the peaking amplifier path 150 is configured to amplify the pre-amplified peaking signal from the power splitter 120, resulting in an amplified peaking signal. The carrier and peaking amplifiers correspond to second amplifier stages of the Doherty amplifier 100, 200.

The carrier amplifier path 130 includes first and second carrier impedance matching circuits 127, 131 and the carrier amplifier die 132. The first and second carrier impedance matching circuits 127, 131 are coupled between the carrier input lead 106 and an input terminal 138 (e.g., gate terminal) of the carrier amplifier die 132. More specifically, the first carrier impedance matching circuit 127, which is coupled to the device substrate 183, represents a first portion of an overall input impedance matching circuit for the carrier amplifier die 132, and the second carrier impedance matching circuit 131, which is coupled to a second heat dissipation structure 162 (e.g., heat dissipation structure 362, FIGS. 3-5), represents a second portion of the overall input impedance matching circuit for the carrier amplifier die 132.

According to one or more embodiments, the carrier amplifier die 132 also is coupled to the second heat dissipation structure 162, which is configured to convey heat produced by the carrier amplifier die 132 to the above-mentioned system heat sink (e.g. heat sink 916 or 1016, FIGS. 9, 10) during operation of the Doherty amplifier 100, 200. The carrier amplifier die 132 is configured to amplify the pre-amplified carrier signal received from the carrier input impedance matching circuits 127, 131 in order to produce an amplified carrier signal at an output terminal 139 (e.g., drain terminal) of the carrier amplifier die 132.

The peaking amplifier path 150 includes first and second peaking impedance matching circuits 128, 151 and the peaking amplifier die 152. The first and second peaking impedance matching circuits 128, 151 are coupled between the peaking input lead 107 and an input terminal 158 (e.g., gate terminal) of the peaking amplifier die 152. More specifically, the first peaking impedance matching circuit 128, which is coupled to the device substrate 183, represents a first portion of an overall input impedance matching circuit for the peaking amplifier die 152, and the second peaking impedance matching circuit 151, which is coupled to the first heat dissipation structure 161 (e.g., heat dissipation structure 361, FIGS. 3-5), represents a second portion of the overall input impedance matching circuit for the peaking amplifier die 152.

According to one or more embodiments, the peaking amplifier die 152 also is coupled to the first heat dissipation structure 161, which is configured to convey heat produced by the peaking amplifier die 152 to the above-mentioned system heat sink (e.g. heat sink 916 or 1016, FIGS. 9, 10) during operation of the Doherty amplifier 100, 200. The peaking amplifier die 152 is configured to amplify the pre-amplified peaking signal received from the peaking input impedance matching circuits 128, 151 in order to produce an amplified carrier signal at an output terminal 159 (e.g., drain terminal) of the peaking amplifier die 152.

According to an embodiment, the peaking amplifier die 152 and the carrier amplifier die 132 are coupled to the first and second heat dissipation structures 161, 162 so that signal paths through the peaking amplifier die 152 and the carrier amplifier die 132 extend in a first direction, indicated by arrows 130 and 150, that is parallel to a first axis 197 of Cartesian coordinate system 194. Conversely, the driver amplifier die 114 may be coupled to the first heat dissipation structure 161 so that the signal path through the driver amplifier die 114 extends in a second direction that is parallel to a second axis 195 of Cartesian coordinate system 194 (i.e., an axis orthogonal to the first axis 197). This arrangement of dies 114, 132, 152 facilitates a compact arrangement of the components of the packaged power amplifier device 182, 282. Further, coupling the driver and peaking amplifier dies 114, 152 to the same heat dissipation structure 161 enables a relatively compact device by eliminating the need for separate heat dissipation structures for such dies.

Each amplifier die 114, 132, 152 includes one or more integrated power transistors, where each power transistor includes a control terminal (e.g., a gate terminal) and first and second current-carrying terminals (e.g., a drain terminal and a source terminal). In a single-stage device, which would include a single power transistor, the control terminal is electrically connected to the input terminal 115, 138, 158, one of the current-carrying terminals (e.g., the drain terminal) is electrically connected to the output terminal 116, 139, 159, and the other current-carrying terminal (e.g., the source terminal) is electrically connected through the first or second heat dissipation structure 161, 162 to a ground reference (or another voltage reference). Conversely, a two-stage amplifier would include two power transistors coupled in series between each input terminal 115, 138, 158 and each output terminal 116, 139, 159.

In Doherty power amplifiers 100 and 200, the output terminal 139 of the carrier amplifier die 132 and the output terminal 159 of the peaking amplifier die 152 are coupled to a power combining node 176 or 276 through an output combining network 170 or 270, in accordance with various embodiments. Referring first to amplifier 100 in FIG. 1, a first end of an output combining network 170 is connected to the output terminal 139 of the carrier amplifier die 132, and a second end of the output combining network 170 is connected to a power combining node 176.

According to an embodiment, output combining network 170 includes one or more transmission lines 172 formed on or within the device substrate 183, along with connections 171, 175 between opposite ends of the transmission line(s) 172 and the carrier and peaking output terminals 139, 159. For example, the total electrical length of the output combining network 170 may be about lambda/4 (λ/4) (i.e., about 90 degrees) at the fundamental frequency of operation, f0, of the amplifier 100. Accordingly, the output combining network 170 is configured to impart about a 90 degree relative phase shift to the amplified carrier signal between the RF output terminal 139 and the power combining node 176 at the fundamental frequency.

According to the embodiment illustrated in FIG. 1, the output terminal 159 of the peaking amplifier die 152 and the combining node 176 may be implemented with a common physical element. More specifically, in an embodiment, the output terminal 159 of the peaking amplifier die 152 is configured to function both as the combining node 176 and as the output terminal 159 of the peaking amplifier die 152. To facilitate combination of the amplified carrier and peaking signals, and as mentioned above, the output terminal 159 (and thus the combining node 176) is connected to the second end of the output combining network 170. In other embodiments, the combining node 176 may be a separate element from the output terminal 159. Either way, in amplifier 100, the amplified carrier and peaking RF signals combine in phase at the combining node 176. Because the output combining network 170 imparts about a 90 degree relative phase shift to the amplified carrier signal between the carrier output terminal 139 and the combining node 176, while essentially no phase shift is imparted to the amplified peaking signal between the peaking output terminal 159 and the combining node 176, the combining topology shown in FIG. 1 may be referred to as a 90/0 combining topology.

Referring now to amplifier 200 in FIG. 2, a different combining topology is shown. More specifically, output combining network 270 is configured to impart phase delays to both the amplified carrier and peaking signals before they reach the combining node 276. More specifically, according to an embodiment, output combining network 270 includes a carrier-side phase delay circuit and a peaking-side phase delay circuit.

The carrier-side phase delay circuit includes connection 271 and one or more first transmission lines 272 between the carrier output terminal 139 and the combining node 276. Similarly, the peaking-side phase delay circuit includes connection 274 and one or more second transmission lines 273 between the peaking output terminal 159 and the combining node 276. The first and second transmission lines 272, 273 are formed on or within the device substrate 183. According to an embodiment, the total electrical length of the carrier-side phase delay circuit may be about lambda/4 (λ/4) (i.e., about 90 degrees) at the fundamental frequency of operation, f0, of the amplifier 200. Accordingly, the carrier-side phase delay circuit is configured to impart about a 90 degree relative phase shift to the amplified carrier signal between the RF output terminal 139 and the power combining node 276 at the fundamental frequency. Conversely, the total electrical length of the peaking-side phase delay circuit may be about lambda/2 (λ/2) (i.e., about 180 degrees) at the fundamental frequency of operation, f0, of the amplifier 200. Accordingly, the peaking-side phase delay circuit is configured to impart about a 180 degree relative phase shift to the amplified peaking signal between the RF output terminal 159 and the power combining node 276 at the fundamental frequency.

Again, in amplifier 200, the output combining network 270 is configured so that the amplified carrier and peaking RF signals combine in phase at the combining node 276. Because the output combining network 270 imparts about a 90 degree relative phase shift to the amplified carrier signal between the carrier output terminal 139 and the combining node 276, while also imparting about a 180 degree relative phase shift to the amplified peaking signal between the peaking output terminal 159 and the combining node 276, the combining topology shown in FIG. 2 may be referred to as a 90/180 combining topology. Although the 90/180 output combining network 270 in amplifier 200 is larger in size than the 90/0 output combining network 170 in amplifier 100, it may have certain performance advantages. More specifically, including the 90/180 combining topology in amplifier 200 may result in improved Doherty performance and bandwidth, when compared with the 90/0 combining topology included in amplifier 100.

According to one or more alternate embodiments, in amplifier 200, the output combining network 270 alternatively may be configured so that the total electrical length of the carrier-side phase delay circuit (e.g., connection 271 and transmission line 272) may be between about lambda/8 (λ/8) (i.e., about 45 degrees) and about lambda/4 (λ/4) (i.e., about 90 degrees), and the total electrical length of the peaking-side phase delay circuit (e.g., connection 274 and transmission line 273) may be between about 3×lambda/2 (3λ/4) (i.e., about 145 degrees) and about lambda/2 (λ/2) (i.e., about 180 degrees) at the fundamental frequency of operation, f0, of the amplifier 200. In such embodiments, the combing node impedance may be a complex number. Such a topology may be referred to as a A-CCL topology. Compared with the above-described 90/0 topology, this topology may exhibit better wideband performance, while keeping the footprint of the amplifier 200 smaller than the above-described 90/180 topology.

In both Doherty power amplifiers 100, 200, the combining node 176, 276 is electrically coupled to an output lead 108 of the packaged power amplifier device 182, 282. Back on the amplifier substrate 180, an output impedance transformer 178 is coupled between the output lead 108 and the RF output terminal 102. Ultimately, the output transformer 178 functions to present proper load impedances to each of the carrier and peaking amplifier dies 132, 152. The resulting amplified RF output signal is produced at RF output terminal 102, to which an output load 190 (e.g., an antenna) is connected.

In addition to the above-described and illustrated components, power amplifier 100 also may include gate and/or drain bias circuitry 192 on the amplifier substrate 180. The gate and/or drain bias circuitry 192 may receive bias voltages from external sources through additional * 103 on the amplifier substrate 180, and may convey those bias voltages to additional leads 109 of the packaged power amplifier device 182, 282. Although not shown in FIG. 1 or 2, additional conductive traces and wire bonds within the packaged power amplifier device 182, 282 may further convey those bias voltages to the gates and/or drains of the power transistors within the driver, carrier, and peaking amplifier dies 114, 132, 152.

Each Doherty power amplifier 100, 200 is configured so that the carrier amplifier path 130 provides amplification for relatively low level input signals, and both the carrier and peaking amplification paths 130, 150 operate in combination to provide amplification for relatively high level input signals. This may be accomplished, for example, by biasing the carrier amplifier 132 so that the carrier amplifier 132 operates in a class AB mode, and biasing the peaking amplifier 152 so that the peaking amplifier 152 operates in a class C mode. Accordingly, the bias voltages provided to the gates and/or drains of the driver amplifier die 114 may configure the driver amplifier to operate in a class AB mode, while the bias voltages provided to the gates and/or drains of the carrier and peaking amplifier dies 132, 152 may be provided to configure the carrier and peaking amplifiers to operate in class AB mode and class C mode, respectively.

Although not shown in FIG. 1 or 2, additional circuitry may be included in each of the Doherty power amplifiers 100, 200. For example but not by way of limitation, harmonic termination circuitry (e.g., circuitry that resonates at one or more harmonics of the fundamental frequency of operation) may be included in the packaged power amplifier device 182, 282 at the inputs and/or outputs of the carrier and peaking amplifiers 132, 152.

Figure 3:
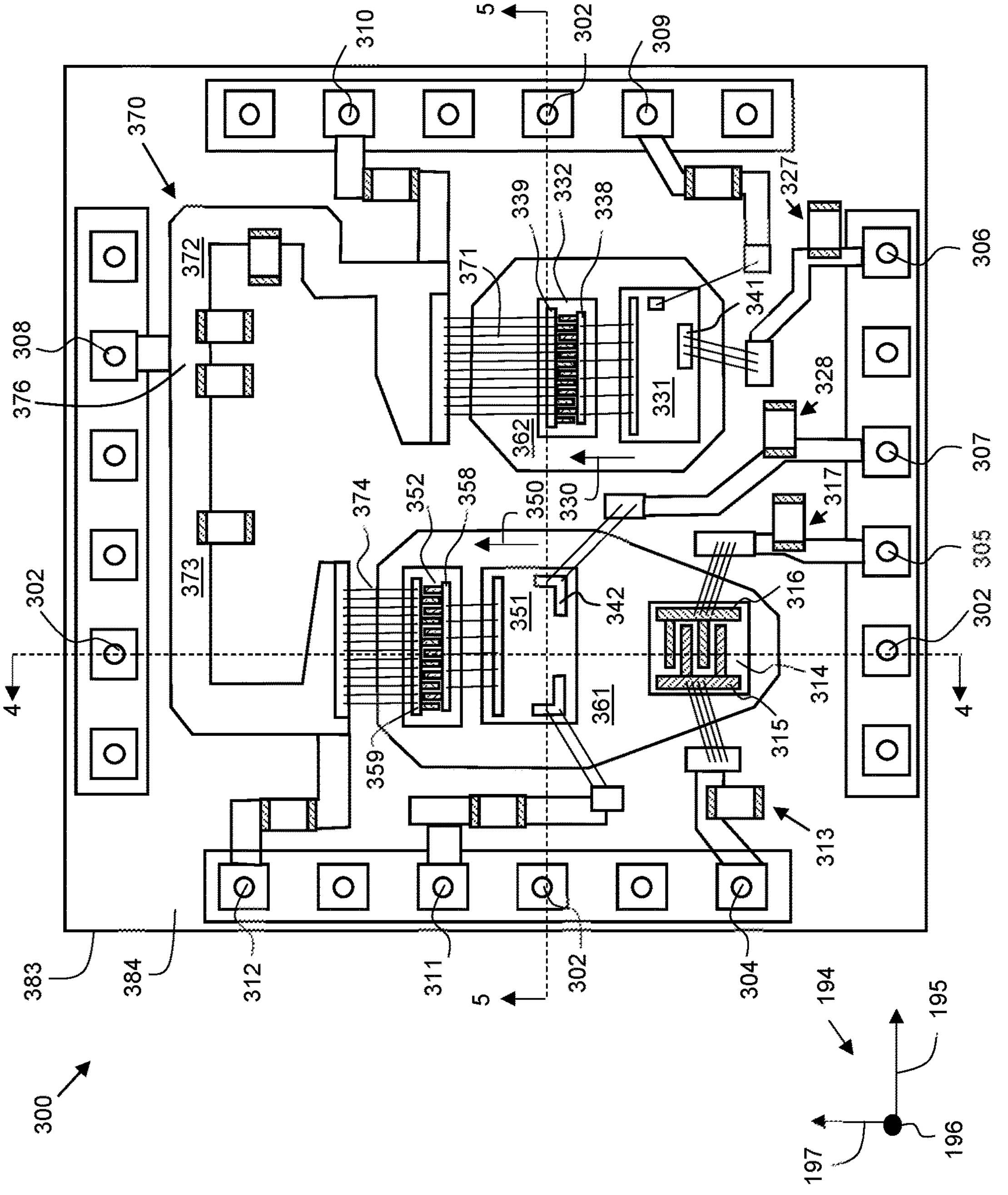
FIG. 3 is a top view of a power amplifier device that houses the driver, carrier, and peaking amplifiers of FIG. 2, in accordance with an example embodiment.
Figure 4:
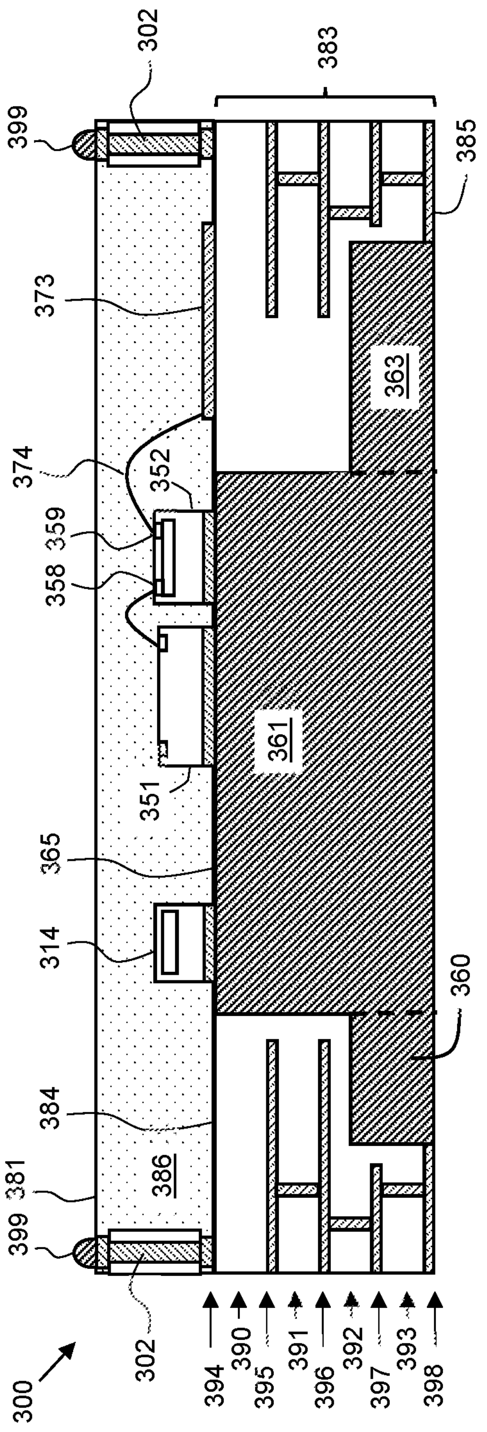
FIG. 4 is a cross-sectional, side view of the power amplifier device of FIG. 3 along line 4-4.
Figure 5:
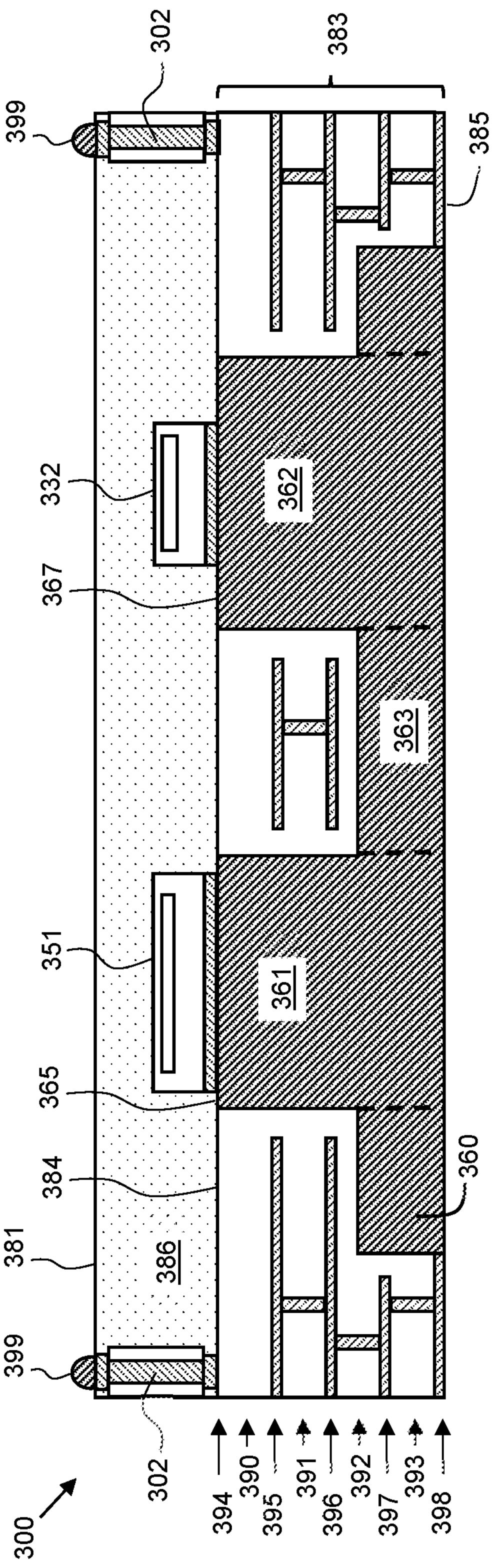
FIG. 5 is a cross-sectional, side view of the power amplifier device of FIG. 3 along line 5-5.

An example of a physical implementation of the packaged power amplifier device 282 of FIG. 2 will now be discussed in conjunction with FIGS. 3-5. More specifically, FIG. 3 is a top view of a power amplifier device 300 that houses the driver, carrier, and peaking amplifiers 114, 132, 152 of FIG. 2, in accordance with an example embodiment. For enhanced understanding, FIG. 3 should be viewed simultaneously with FIGS. 4 and 5, where FIG. 4 is a cross-sectional, side view of the power amplifier device 300 along line 4-4, and FIG. 5 is a cross-sectional, side view of the power amplifier device 300 along line 5-5.

FIG. 3 is a top view of a packaged power amplifier device 300 that embodies the circuitry within the packaged power amplifier device 282 of FIGS. 1, 2, in accordance with an example embodiment. To enhance understanding, FIG. 3 should be viewed simultaneously with FIGS. 4 and 5, which are cross-sectional, side views of the device 300 of FIG. 3 along lines 4-4 and 5-5, respectively. Essentially, packaged power amplifier device 300 includes a substantial portion of a Doherty power amplifier coupled to a multi-layer device substrate 383 (or to heat dissipation structures 361, 362 that extend through the device substrate 383). The portions of the Doherty power amplifier coupled to the device substrate 383 or to the heat dissipation structures 361, 362 include a plurality of power transistor dies 314, 332, 352 (e.g., dies 114, 132, 152, FIGS. 1, 2), an output combining network 370 (e.g., network 270, FIGS. 1, 2, although alternatively network 170, FIGS. 1, 2), various impedance matching circuits 313, 317, 327, 328, 331, 351 (e.g., circuits 113, 117, 127, 128, 131, 151) and other electrical components. Notably, the packaged power amplifier device 282 does not include a power splitter (e.g., power splitter 120, FIGS. 1, 2), because the power splitter instead is implemented on the amplifier substrate (e.g., substrate 180, FIGS. 1, 2), rather than within the device 300. In addition, packaged power amplifier device 300 includes a plurality of electrically conductive leads 302, 304, 305, 306, 307, 308, 309, 310, 311, 312 (e.g., leads 104-108, FIGS. 1, 2) for conveying signals or bias voltages, or for connecting to ground references, as will be discussed in detail below.

Packaged power amplifier device 300 includes a device substrate 383 (e.g., substrate 183, FIGS. 1, 2) in the form of a multiple-layer printed circuit board (PCB) or other suitable substrate. The device substrate 383 has a top surface 384 (also referred to as a "front-side" or "mounting surface") and a bottom surface 385 (also referred to as a "back-side" or "heat dissipation surface"). As used herein, the term "mounting surface 384 of the device substrate 383" includes the top surface of the substrate 383, but excludes the upper surfaces of first and second heat dissipation structures 361, 362, which may be substantially co-planar with the mounting surface 384 of the device substrate 383.

As will be described in more detail below, the leads 302, 304-312 and a plurality of components are coupled to the mounting surface 384 of the device substrate 383, and the power amplifier dies 314, 332, 352 are coupled to the heat dissipation structures 361, 362. As shown in FIGS. 4 and 5, nonconductive encapsulant material 386 (e.g., a plastic encapsulant) is disposed on the mounting surface 384 and over and around the components, dies 314, 332, 352, and leads 302, 304-312 to define a top surface 381 (also referred to as a "contact surface") of the device 300. Essentially, the encapsulant material 386 covers the components and dies 314, 332, 352. As shown in FIG. 3, the encapsulant material 386 has a thickness that is greater than the maximum height of the components (e.g., power transistor dies 314, 332, 352) covered by the encapsulant material 386, so that encapsulant material 386 is present between the top surfaces of those components and the top surface 381 of the device 300.

Lower or proximal ends of the leads 302, 304-312 are coupled to conductive features on the mounting surface 384 of the device substrate 383. The leads 302, 304-312 extend perpendicularly from the mounting surface 384 to their upper or distal ends. The upper or distal ends of the leads 302, 304-312 are exposed at the contact surface 381 (i.e., leads 302, 304-312 are exposed at the top surface of the encapsulant material 386). Conductive attachment material 399 (e.g., solder balls, solder paste, or conductive adhesive) is disposed on the exposed distal ends of the leads 302, 304-312 to facilitate electrical and mechanical attachment of the device 300 to a system substrate (e.g., amplifier substrate 180 or 680, FIGS. 2, 6), as will be described in more detail later.

In the embodiment illustrated in FIGS. 3-5, the leads 302, 304-312 are formed from conductive pillars, which may be attached to or formed on conductive pads at the mounting surface 384 of the device substrate 383. In some embodiments, sets of such leads 302, 304-312 may be encased in a non-conductive retention structure (e.g., a plastic or ceramic structure) prior to attaching the leads 302, 304-312 to the device substrate 383. In other embodiments, the leads 302, 304-312 may have other forms, such as, Quad Flat No-Lead (QFN) package leads, gull wing leads, Land Grid Array (LGA) package leads, and Ball Grid Array (BGA) package leads, for example but not by way of limitation.

As depicted in FIGS. 4 and 5, the device substrate 383 includes a plurality of dielectric layers 390, 391, 392, 393 (e.g., formed from FR-4, ceramic, or other PCB dielectric materials), in an alternating arrangement with a plurality of conductive layers 394, 395, 396, 397, 398. A top surface 384 of the device substrate 383 is defined by a patterned conductive layer 394, and a bottom surface 385 of the device substrate 383 is defined by a conductive layer 398 and bottom surfaces of the heat dissipation structures 361, 362. In the embodiment illustrated in FIGS. 4 and 5, layers 394 and 398 do not overlie the top and bottom surfaces, respectively, of heat dissipation structures 361, 362. In other embodiments, layer 394 and/or 398 may overlie the top and/or bottom surface of the heat dissipation structures 361, 362, and/or the top and/or bottom surfaces of the heat dissipation structures 361, 362 may be plated. It should be noted that, although device substrate 383 is shown to include four dielectric layers 390-393 and five conductive layers

394-398, other embodiments of a device substrate may include more or fewer dielectric layers and/or conductive layers.

Each of the various conductive layers 394-398 may have a primary purpose, and also may include conductive features that facilitate signal and/or voltage/ground routing between other layers. Although the description below may indicate a primary purpose for each of the conductive layers 394-398, it should be understood that the layers (or their functionality) may be arranged differently from the particular arrangement best illustrated in FIGS. 4 and 5 and discussed below.

For example, in an embodiment, the patterned conductive layer 394 at the mounting surface 384 of the device substrate 383 may primarily function as a signal conducting layer. More specifically, layer 394 includes a plurality of conductive features (e.g., conductive bond pads and traces) that serve as attachment points for various discrete components, and also provide electrical connectivity between the dies 314, 332, 352 and the other discrete components. In addition, layer 394 may include a plurality of conductive bond pads that are specifically designated for attachment of electrically conductive signal, bias, and/or ground leads (e.g., leads 302, 304-312).

Other patterned conductive layers 395-397 may function as an RF ground layer, a signal routing layer, and/or a layer that conveys bias voltages to the power transistors within the dies 314, 332, 352, in various embodiments. According to an embodiment, the conductive layer 398 at the bottom surface 385 of the device 300 may function as a system ground layer. Conductive vias extend through the dielectric layers 390-393 to electrically connect the various conductive layers 394-398.

According to an embodiment, the device substrate 383 also includes one or more heat dissipation structures 361, 362, which extend between the top and bottom surfaces 384, 385 of the device substrate 383. In some embodiments, the heat dissipation structures 361, 362 may be joined together by a thermal base structure 363 to form a single integrated thermal structure 360. In such an embodiment, the thermal structure 360 includes the thermal base structure 363 and two pedestals corresponding to the two portions of the heat dissipation structures 361, 362 that extend from the base structure 363 to the mounting surface 384 of the device substrate 383. In an alternate embodiment, heat dissipation structures 361, 362 may be separate structures (e.g., thermal base structure 363 may be excluded), as indicated in FIGS. 4 and 5 with dashed vertical lines through base structure 363 (i.e., the dashed vertical lines represent sidewalls of separate heat dissipation structures 361, 362).

Either way, the first heat dissipation structure 361 has a first thermal surface 365 that is exposed at the mounting surface 384 of the device substrate 383, the second heat dissipation structure 362 has a second thermal surface 367 that is exposed at the mounting surface 384 of the device substrate 383, and the first and second thermal surfaces 365, 367 are physically separated by a portion of the mounting surface 384 of the device substrate 383 that is present between the first and second thermal surfaces 365, 367. Sidewalls (not numbered) of the heat dissipation structures 361, 362 are separated by portions of the device substrate 383 (e.g., portions of dielectric layers 390-393, as shown in FIG. 5, or portions of all dielectric layers 390-393 when base structure 363 is excluded). The first and second thermal surfaces 365, 367 may or may not be plated and/or covered by portions of layer 394.

According to an embodiment, driver and peaking amplifier dies 314 and 352 (e.g., dies 114, 152, FIGS. 1, 2) are physically and electrically coupled (or connected) to surface 365 of the first heat dissipation structure 361, and carrier amplifier die 332 (e.g., die 132, FIGS. 1, 2) is physically and electrically coupled to surface 367 of the second heat dissipation structure 362. The driver and peaking amplifier dies 314 and 352 may be directly connected to the first thermal surface 365, in some embodiments, or a portion of the upper conductive layer 394 and/or a plating layer may be between the dies 314, 352 and the first thermal surface 365. Similarly, the carrier amplifier die 332 may be directly connected to the second thermal surface 367, in some embodiments, or a portion of the upper conductive layer 383 and/or a plating layer may be between the die 332 and the second thermal surface 367.

The driver amplifier die 314 includes a power transistor that is integrally formed within the die 314, and that functions as a driver amplifier. The driver amplifier die 314 has an input terminal 315 coupled to the control terminal (e.g., gate terminal) of the integrated power transistor, and an output terminal 316 that is coupled to the output terminal (e.g., drain terminal) of the integrated transistor. The driver amplifier die 314 is coupled to the first thermal surface 365 so that a first signal path through the driver amplifier die 314 (i.e., a signal path between terminals 315, 316) extends in a first direction that is parallel to the first axis 195 of Cartesian coordinate system 194.

Further, the peaking amplifier die 352 includes a power transistor that is integrally formed within the die 352, and that functions as a first final-stage amplifier. The peaking amplifier die 352 has an input terminal 358 coupled to the control terminal (e.g., gate terminal) of the integrated power transistor, and an output terminal 359 that is coupled to the output terminal (e.g., drain terminal) of the integrated power transistor. The peaking amplifier die 352 is coupled to the first thermal surface 365 so that a peaking signal path through the peaking amplifier die 352 (i.e., a signal path between leads 358, 359) extends in a second direction that is parallel to the second axis 197 of Cartesian coordinate system 194. As mentioned previously, coupling the driver and peaking amplifier dies 314, 352 to the same heat dissipation structure 361 enables a relatively compact module by eliminating the need for separate heat dissipation structures for such dies.

Similarly, the carrier amplifier die 332 includes a power transistor that is integrally formed within the die 332, and that functions as a second final-stage amplifier, where the first and second final-stage amplifiers are arranged in parallel with each other. The carrier amplifier die 332 has an input terminal 338 coupled to the control terminal (e.g., gate terminal) of the integrated power transistor, and an output terminal 339 that is coupled to the output terminal (e.g., drain terminal) of the integrated power transistor. The carrier amplifier die 352 is coupled to the second thermal surface 367 so that a carrier signal path through the carrier amplifier die 332 (i.e., a signal path between leads 338, 339) also may extend in the second direction, which is parallel to the second axis 197 of Cartesian coordinate system 194. In an alternate embodiment, the carrier amplifier die 332 may be rotated by 90 degrees so that the carrier signal path extends in the first direction (i.e., a direction parallel to the first axis 195).

According to various embodiments, the above-referenced power transistors that are integrally formed within the driver amplifier die 314, the carrier amplifier die 332, and the peaking amplifier die 352 each may be implemented, for example, using a field effect transistor (FET), such as laterally-diffused metal oxide semiconductor (LDMOS)

FETs or high electron mobility transistors (HEMTs). For example, the power transistors within the dies 314, 332, 352 each may be implemented with a III-V field effect transistor (e.g., a HEMT), such as a gallium nitride (GaN) FET (or another type of III-V transistor, including a GaAs FET, a GaP FET, an InP FET, or an InSb FET). In addition or alternatively, the power transistors within the dies 314, 332, 352 may be implemented with a silicon-based FET (e.g., a laterally diffused metal oxide semiconductor (LDMOS) FET) or a silicon germanium (SiGe) FET, in some embodiments. Further, the semiconductor technology of the driver amplifier die 314, the carrier amplifier die 332, and the peaking amplifier die 352 may be the same, or the driver amplifier die 314 may utilize one semiconductor technology, while the carrier and peaking amplifier dies 332, 352 utilize a different semiconductor technology.

The description and claims may refer to each transistor as including a control terminal and two current-conducting terminals. For example, using terminology associated with FETs, a "control terminal" refers to a gate lead of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

As described above and best shown in FIG. 3, the driver amplifier die 314 and the peaking amplifier die 352 are both coupled to the surface 365 of the first heat dissipation structure 361 so that the direction of the signal path through the driver amplifier die 314 is orthogonal to (i.e., angularly offset by 90 degrees) the direction of the signal path through the peaking amplifier die 352. The orthogonal orientations of the driver and peaking amplifier dies 314, 352 reduces any mutual coupling between the driver and peaking amplifier dies 314, 352, and also provides the opportunity to reduce module size.

The bottom surfaces of the heat dissipation structures 361, 362 and the bottom surface of base structure 363, when included, are exposed at the bottom surface 385 of the device substrate 383. Alternatively, the bottom surfaces of the heat dissipation structures 361, 362 may be covered with the bottom conductive layer 398 and/or a plating layer. Either way, the heat dissipation structures 361, 362 are configured to provide a thermal pathway between the dies 314, 332, 352 and the bottom surfaces of the heat dissipation structures 361, 362 (and thus the bottom surface 385 of the device substrate 383).

In some embodiments, and particularly when base structure 363 is excluded, the heat dissipation structures 361, 362 may include separate conductive metallic coins that are press-fit and/or attached into through-holes that extend between the surfaces 384, 385 of the device substrate 383. Alternatively, when base structure 363 is included, structures 361-363 may be integrally formed together and/or machined from a single block of thermally conductive material. Either way, as will be described in more detail in conjunction with FIG. 9, the exposed bottom surfaces 364, 366 of the heat dissipation structures (or the portion of the conductive layer 398 overlying those surfaces) may be physically and thermally coupled to a heat sink (e.g., heat sink 916, FIG. 9) when the device 300 is integrated within a larger electrical system.

Now that the general physical construction of device 300 has been described, the amplifier circuitry embedded within device 300 will now be described in additional detail. In particular, the packaged power amplifier device 300 includes an RF signal input lead 304 (e.g., RF input lead 104, FIGS. 1, 2), a driver amplifier path that includes driver amplifier die 314 (e.g., die 114, FIGS. 1, 2), a carrier amplifier path 330 that includes the carrier amplifier die 332 (e.g., die 132, FIGS. 1, 2), a peaking amplifier path 350 that includes the peaking amplifier die 352 (e.g., die 152, FIGS. 1, 2), an output combining network 370 (e.g., network 270, FIG. 2), a combining node 376 (e.g., combining node 276, FIG. 2), components associated with input and output impedance matching circuits, and an RF signal output lead 308 (e.g., RF output lead 108, FIGS. 1, 2).

Lead 304 functions as the RF input lead for the device 300. According to an embodiment, lead 304 is coupled to an RF signal input pad (not numbered) at the mounting surface 384 of the device substrate 383. Through one or more conductive structures of the substrate 383 (e.g., vias, traces, and/or wirebonds), the RF input lead 304 is electrically coupled through a driver input matching circuit 313 (e.g., circuit 113, FIGS. 1, 2), a conductive pad (not numbered) at the mounting surface 384, and a conductive connection (e.g., wirebonds, not numbered) to the input terminal 315 (e.g., gate terminal) of the driver amplifier die 314. Although not illustrated in detail, input impedance matching circuit 313 may include a plurality of components to implement, for example, portions of a lowpass or bandpass filter in the form of a T-match network or a pi-match network. The plurality of impedance matching circuit components may include, for example, various inductors, capacitors, and/or resistors in the form of discrete components that are mounted to the mounting surface 384 of the device substrate 314. Alternatively, some or all of the plurality of impedance matching components may be incorporated in an integrated passive device (IPD) that is coupled to the mounting surface 384. However it is implemented, the driver input matching circuit 313 is configured to transform the gate impedance of the power transistor within die 314 to a more desirable system level impedance (e.g., 50 ohms).

The driver amplifier die 314 is configured to amplify the input RF signal received from the input matching circuit 313, in order to produce a pre-amplified RF signal at the output terminal 316 (e.g., drain terminal) of the driver amplifier die 314. Using terminology associated with FETs, the driver amplifier die 314 includes a power transistor with a gate terminal electrically coupled to the input terminal 315, a drain terminal electrically coupled to the output terminal 316, and a source terminal electrically coupled to a conductive layer (not numbered) on a bottom surface of the die 314. Because the conductive layer is connected to the first heat dissipation structure 361, which in turn may be coupled to a system ground, the conductive layer on the bottom surface of the die 314 may provide a ground node for the source terminal.

A driver output matching circuit 317 (e.g., circuit 117, FIGS. 1, 2) is coupled to the output terminal 316 of the driver amplifier die 314 through a conductive connection (e.g., wirebonds, not numbered) and a conductive pad (not numbered) at the mounting surface 384 of the device substrate 383. In addition, the driver output matching circuit 317 is coupled to a driver output terminal 305, which in turn is coupled to an input (e.g., input 121, FIGS. 1, 2) of a power splitter (e.g., splitter 120, FIGS. 1, 2) when the device 300 is coupled to an amplifier substrate (e.g., substrate 180, FIGS. 1, 2). As with matching circuit 313, the driver output matching circuit 317 may include a plurality of components (e.g., inductors, capacitors, and/or resistors) in the form of discrete components and/or an IPD mounted to the mounting surface 384 of the device substrate 383. The driver output matching circuit 317 and the driver output terminal 305 are configured to perform a partial impedance transformation between the output terminal 316 of the driver amplifier die 314 and the power splitter (e.g., power splitter 120, FIGS. 1, 2).

As discussed above, during operation of device 300, the pre-amplified signal produced by the driver amplifier die 114 is transferred off the device 300 (and onto the amplifier substrate) through the driver output terminal 305. On the amplifier substrate (e.g., substrate 180, FIGS. 1, 2), the remainder of the impedance transformation may be performed by a driver input matching circuit (e.g., circuit 118, FIGS. 1, 2). The overall impedance transformation between the driver output terminal 316 and the power splitter input (e.g., input 121, FIGS. 1, 2) will be discussed in more detail later in conjunction with FIG. 7.

On the amplifier substrate (e.g., substrate 183, FIGS. 1, 2), the power of the pre-amplified signal is divided into carrier and peaking signals by the power splitter (e.g., power splitter 120, FIGS. 1, 2). The carrier and peaking signals provided at the power splitter outputs (e.g., outputs 122, 123, FIGS. 1, 2) are provided to carrier and peaking input terminals 306, 307 (e.g., terminals 106, 107, FIGS. 1, 2) of the device 300.

The carrier amplifier path 330 (e.g., carrier amplifier path 130, FIGS. 1, 2) is coupled to the carrier input terminal 306. The carrier amplifier path 330 includes first and second carrier input matching circuits 327, 331 (e.g., circuits 127, 131, FIGS. 1, 2) and a power transistor integrated within a carrier amplifier die 332. The carrier input matching circuits 327, 331 are coupled between the carrier input terminal 306 (e.g., terminal 106, FIGS. 1, 2) and the input terminal 338 (e.g., gate terminal) of carrier amplifier die 332. According to an embodiment, the first carrier input matching circuit 327 is implemented with a plurality of components (e.g., inductors, capacitors, and/or resistors) in the form of discrete components and/or an IPD coupled to the mounting surface 384 of the device substrate 383, and the second carrier input matching circuit 331 is implemented with various inductive connections (e.g., wirebonds) and additional components that are integrally formed within a carrier IPD that is mounted to the heat dissipation structure 362. In an alternate embodiment, the carrier amplifier die 332 may be mounted on the heat dissipation structure 362, and the carrier IPD may be coupled to the mounting surface 384 of the device substrate 383.

However they are implemented, the carrier input terminal 306 and the carrier input matching circuits 327, 331 are configured to transform the impedance between one output (e.g., output 122, FIGS. 1, 2) of the splitter (e.g., splitter 120, FIGS. 1, 2) and the input terminal 338 of the carrier amplifier die 332. A phase shifting circuit (e.g., circuit 124, FIGS. 1, 2) on the amplifier substrate (e.g., substrate 180, FIGS. 1, 2) allows the phase of the pre-amplified carrier signal to be modified, as desired for tuning. The overall impedance transformation between the power splitter output and the input terminal 338 of the carrier amplifier die 332 will be discussed in more detail later in conjunction with FIG. 8.

The carrier amplifier die 332 is configured to receive, at input terminal 338, the pre-amplified carrier signal produced at a first output (e.g., output 122, FIGS. 1, 2) of the power splitter (e.g., power splitter 120, FIGS. 1, 2), and to amplify the pre-amplified carrier signal to produce an amplified carrier signal at the output terminal 339 of the carrier amplifier die 332. Using terminology associated with FETs, the carrier amplifier die 332 includes a power transistor with a gate terminal electrically coupled to the input terminal 338, a drain terminal electrically coupled to the output terminal 339, and a source terminal electrically coupled to a conductive layer (not numbered) on a bottom surface of the die 332. Because the conductive layer is connected to the second heat dissipation structure 362, which in turn may be coupled to ground, the conductive layer on the bottom surface of the die 332 may provide a ground node for the source terminal.

The peaking amplifier path 350 (e.g., peaking amplifier path 150, FIGS. 1, 2) is coupled to the peaking input terminal 307. The peaking amplifier path 350 includes first and second peaking input matching circuits 328, 351 (e.g., circuits 128, 151, FIGS. 1, 2) and a power transistor integrated within a peaking amplifier die 352. The peaking input matching circuits 328, 351 are coupled between the peaking input terminal 307 (e.g., terminal 107, FIGS. 1, 2) and the input terminal 358 (e.g., gate terminal) of peaking amplifier die 352. According to an embodiment, the first peaking input matching circuit 328 is implemented with a plurality of components (e.g., inductors, capacitors, and/or resistors) in the form of discrete components and/or an IPD coupled to the mounting surface 384 of the device substrate 383, and the second peaking input matching circuit 351 is implemented with various inductive connections (e.g., wirebonds) and additional components that are integrally formed within a peaking IPD that is mounted to the heat dissipation structure 361. In an alternate embodiment, the peaking amplifier die 352 may be mounted on the heat dissipation structure 361, and the peaking IPD may be coupled to the mounting surface 384 of the device substrate 383.

However they are implemented, the peaking input terminal 307 and the peaking input matching circuits 328, 351 are configured to transform the impedance between a second output (e.g., output 123, FIGS. 1, 2) of the splitter (e.g., splitter 120, FIGS. 1, 2) and the input terminal 358 of the peaking amplifier die 352. A phase shifting circuit (e.g., circuit 126, FIGS. 1, 2) on the amplifier substrate (e.g., substrate 180, FIGS. 1, 2) allows the phase of the pre-amplified peaking signal to be modified, as desired for tuning. The overall impedance transformation between the power splitter output and the input terminal 358 of the peaking amplifier die 352 will be discussed in more detail later in conjunction with FIG. 8.

The peaking amplifier die 352 is configured to receive, at input terminal 358, the pre-amplified peaking signal produced at a second output (e.g., output 123, FIGS. 1, 2) of the power splitter (e.g., power splitter 120, FIGS. 1, 2), and to amplify the pre-amplified peaking signal to produce an amplified peaking signal at the output terminal 359 of the peaking amplifier die 352. Using terminology associated with FETs, the peaking amplifier die 352 includes a power transistor with a gate terminal electrically coupled to the input terminal 358, a drain terminal electrically coupled to the output terminal 359, and a source terminal electrically coupled to a conductive layer (not numbered) on a bottom surface of the die 352. Because the conductive layer is connected to the first heat dissipation structure 361, which in turn may be coupled to ground, the conductive layer on the bottom surface of the die 352 may provide a ground node for the source terminal.

The output terminals 339, 359 of the carrier and peaking amplifier dies 332, 352 are coupled through an output combining network 370 (e.g., network 270, FIG. 2) to a power combining node 376 (e.g., node 176, FIGS. 1, 2). According to an embodiment, a first portion of the output combining network 370 is coupled between the output terminal 339 of the carrier amplifier die 332 and the combining node 376, and a second portion of the output combining network 370 is coupled between the output terminal 359 of the peaking amplifier die 352 and the combining node 376.

The first portion of the output combining network 370 includes a plurality of elements that are configured to impart about a 90 degree phase shift to the amplified carrier signal between the output lead 339 of the carrier amplifier die 332 and the power combining node 376. In other words, the total electrical length of the first portion of the output combining network 370 may be about lambda/4 (λ/4) (i.e., about 90 degrees) at the fundamental frequency of operation, f0, of the amplifier. Accordingly, the output combining network 370 is configured to impart about a 90 degree relative phase shift to the amplified carrier signal between the output lead 339 and the power combining node 376 at the fundamental frequency.

In one or more embodiments, the first portion of the output combining network 370 includes a first connection 371 (e.g., a wirebond array), and a first transmission line 372 that has a first end and a second end. In the illustrated embodiment, the first connection 371 is coupled between the output terminal 339 of the carrier amplifier die 332 and the first end of the first transmission line 372.

Conversely, the second portion of the output combining network 370 includes a plurality of elements that are configured to impart about a 180 degree phase shift to the amplified peaking signal between the output lead 359 of the peaking amplifier die 352 and the power combining node 376. In other words, the total electrical length of the second portion of the output combining network 370 may be about lambda/2 (λ/2) (i.e., about 180 degrees) at the fundamental frequency of operation, f0, of the amplifier. Accordingly, the output combining network 370 is configured to impart about a 180 degree relative phase shift to the amplified peaking signal between the output lead 359 and the power combining node 376 at the fundamental frequency.

In one or more embodiments, the second portion of the output combining network 370 includes a second connection 374 (e.g., a wirebond array), and a second transmission line 373 with a first end and a second end. In the illustrated embodiment, the second connection 374 is coupled between the output terminal 359 of the peaking amplifier die 352 and a first end of the second transmission line 373. A second end of the second transmission line 373 is coupled to the second end of the first transmission line 372. The intersection of the ends of the first and second transmission lines 372, 373 corresponds to the power combining node 376. During operation of device 300, the amplified carrier and peaking signals combine in phase at the power combining node 376.

The power combining node 376 is electrically coupled to the device output terminal 308 (e.g., terminal 108, FIGS. 1, 2). When the device 300 is coupled to an amplifier substrate (e.g., substrate 180, FIGS. 1, 2), the device output terminal 308 is coupled to the proximal end of an output impedance transformer (e.g., output impedance transformer 178, FIGS. 1, 2), and the distal end of the output impedance transformer is coupled to an RF output terminal (e.g., RF output terminal 102, FIGS. 1, 2). As discussed previously, the output impedance transformer 178 functions to present proper load impedances to each of the carrier and peaking amplifier dies 332, 352. The resulting amplified RF output signal is produced at the RF output terminal.

As discussed previously in conjunction with FIGS. 1, 2, the driver amplifier die 314 may be biased to operate in class AB mode. Further, for proper Doherty operation, the carrier amplifier die 332 may be biased to operate in class AB mode, and the peaking amplifier die 352 may be biased to operate in class C mode. To accomplish this biasing, a plurality of gate and drain bias voltages may be provided by external bias voltage sources. According to an embodiment, the gate and drain bias voltages for the driver amplifier die 314 are provided through leads 304 and 305, respectively. The gate and drain bias voltages for the carrier amplifier die 332 are provided through leads 309 and 310, respectively. Finally, the gate and drain bias voltages for the peaking amplifier die 352 are provided through leads 311 and 312, respectively. In addition, although not shown in FIGS. 3-5, and as mentioned previously, additional circuitry (e.g., harmonic termination circuitry) may be included in the packaged power amplifier device 300 at the inputs and/or outputs of the carrier and peaking amplifier dies 332, 352.

As discussed in conjunction with FIGS. 1-5, the packaged power amplifier device 300 may be coupled to an amplifier substrate (e.g., amplifier substrate 180, FIGS. 1, 2). FIG. 6 is a top view of a physical implementation of a power amplifier system 600 with the power amplifier device 300 of FIG. 3 mounted on the mounting surface of an amplifier substrate 680, along with a power splitter 620 (e.g., power splitter 120, FIGS. 1, 2), an output impedance transformer 678 (e.g., output impedance transformer 178, FIGS. 1, 2), and other amplifier features, in accordance with an example embodiment.

According to one or more embodiments, the packaged power amplifier device 300 is mounted on the amplifier substrate 680 by first applying conductive attachment material (e.g., material 399, FIGS. 4, 5, such as solder balls, solder paste, or conductive adhesive) on the exposed distal ends of the leads 302, 304-312 (FIG. 3). The device 300 is then oriented with the top device surface (e.g., top surface 381, FIGS. 4, 5) facing the mounting surface of the amplifier substrate 680, and the distal ends of the device leads 302, 304-312 (FIG. 3) are aligned with corresponding bond pads (e.g., bond pads 604-607, FIG. 6) on the mounting surface of the amplifier substrate 680. The distal ends of the device leads 302, 304-312 (FIG. 3) are then attached to the bond pads with the conductive attachment material. In this orientation, the heat dissipation structure 360 of the device 300 is facing outward. As will be described later in conjunction with FIG. 9, this enables the heat generated by the dies within the device 300 to be removed through the top of the device 300. This is referred to as "top side cooling" the device 300.

As indicated previously, the amplifier substrate 680 may include, for example, a PCB or other suitable substrate. An amplifier input terminal 601 (e.g., input terminal 101, FIGS. 1, 2) and an amplifier output terminal 602 (e.g., output terminal 102, FIGS. 1, 2) are coupled to the amplifier substrate 680. When incorporated into a larger RF system, the amplifier input terminal 601 is coupled to an RF signal source, and the amplifier output terminal 602 is coupled to a load (e.g., load 190, FIGS. 1, 2). The RF signal source provides an input RF signal, which is an analog signal that includes spectral energy that typically is centered around one or more carrier frequencies. Fundamentally, the power amplifier system 600 is configured to amplify the input RF signal received at the amplifier input terminal 601, and to produce an amplified output RF signal at the amplifier output terminal 602.

According to an embodiment, the input RF signal received at the amplifier input terminal 601 is conveyed through a first impedance matching circuit 610 (e.g., circuit 110, FIGS. 1, 2) on the amplifier substrate 680 to a substrate bond pad 604 to which a device input lead (e.g., lead 104, 304, FIGS. 1-3) of the packaged power amplifier device 300 is coupled. As described in detail above, the input RF signal is then amplified through a driver amplifier (e.g., including driver amplifier die 314, FIG. 3) within the packaged power amplifier device 300. The driver amplifier corresponds to a first amplifier stage of the amplifier system 600.

The driver amplifier die produces a pre-amplified RF signal, which is conveyed through a driver output impedance matching circuit (e.g., circuit 117, 317, FIGS. 1-3) to a driver output lead (e.g., lead 105, 305, FIGS. 1-3) of the packaged power amplifier device 300.

The driver output lead (e.g., lead 105, 305, FIGS. 1-3) is coupled to another substrate bond pad 605 on the amplifier substrate 680. Now back on the amplifier substrate 680, the pre-amplified RF signal is conveyed through an additional impedance matching circuit 618 (e.g., circuit 118, FIG. 1) on the amplifier substrate 380 to an input 621 (e.g., input 121, FIGS. 1, 2) of the power splitter 620 (e.g., splitter 120, FIGS. 1, 2).

Figure 7:
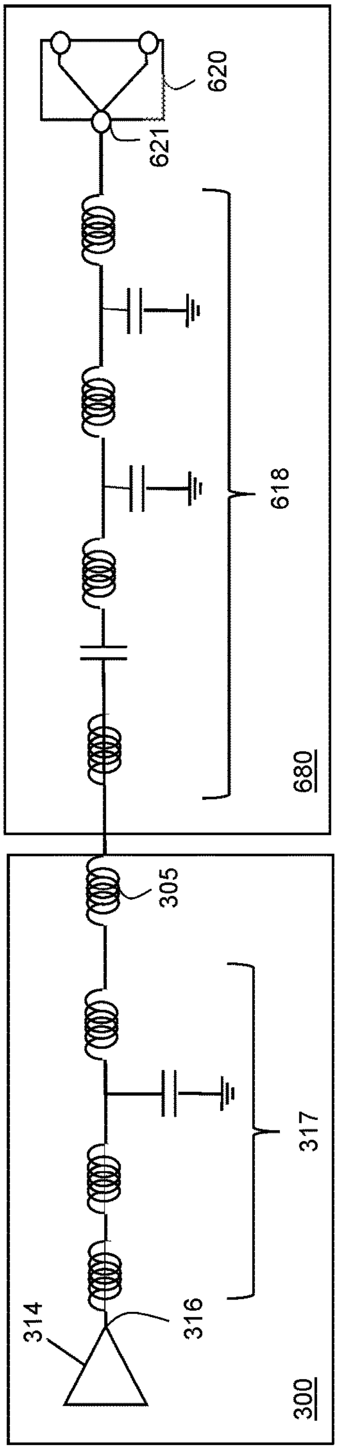
FIG. 7 is a schematic diagram of a portion of a Doherty power amplifier between a driver stage output and a splitter input, in accordance with an example embodiment.

According to one or more embodiments, the overall impedance matching circuit between the output terminal of the driver amplifier die (e.g., terminal 316 of die 314, FIG. 3) and the input 621 to the power splitter 620 (e.g., input 121 of splitter 120, FIGS. 1, 2) is modeled in the schematic diagram of FIG. 7. As described above, the overall impedance matching circuit includes a driver output impedance matching circuit 317 (FIG. 3) coupled between the output terminal 316 (FIG. 3) of the driver amplifier die 314 (FIG. 3) and the driver output terminal 305 (FIG. 3) of the device 300. According to an embodiment, and as also shown in FIG. 3, the driver output impedance matching circuit 317 includes a plurality of series coupled inductances associated with wirebonds coupled to the output terminal 316, and a series of conductive trace segments between those wirebonds and the driver output terminal 305. In addition, the driver output impedance matching circuit 317 may include one or more shunt capacitors and/or other passive components.

The overall impedance matching circuit also includes a series inductance associated with the driver output terminal 305. According to an embodiment, an inductance value for the driver output terminal 305 may be in a range of about 0.25 nanohenries (nH) to about 0.75 nH, although the inductance may be smaller or larger, as well.

Further still, the overall impedance matching circuit also includes an additional impedance matching circuit 618 (e.g., circuit 118, FIGS. 1, 2) between the driver output terminal 305 and the input 621 to the power splitter 620. As also shown in FIG. 6, this additional impedance matching circuit 618 includes a plurality of series coupled inductances associated with the bond pad 605 (FIG. 6) to which the driver output terminal 305 is coupled, along with a series of conductive transmission line segments (schematically represented with inductances in FIG. 7) on the amplifier substrate 680 between the driver output terminal 305 and the input 621 to the power splitter 620. In addition, the additional impedance matching circuit 618 may include one or more series and/or shunt capacitors and/or other passive components.

Referring again to FIG. 6, the power splitter 620 is configured to divide the pre-amplified RF signal received at input 621 into first and second pre-amplified RF signals (or carrier and peaking signals), which are provided at power splitter outputs 622, 623 (e.g., outputs 122, 123, FIGS. 1, 2), respectively. As discussed previously, the power splitter 620 is configured to impart a phase difference (e.g., about a 90 degree phase difference) between the first and second pre-amplified RF signals. In such an embodiment, at outputs 622 and 623, the carrier and peaking signals may be about 90 degrees out of phase from each other.

The outputs 622, 623 of the power splitter 620 are connected through phase shifting circuits 624, 626 (e.g., circuits 124, 126, FIGS. 1, 2) on the amplifier substrate 680 to substrate bond pads 606 and 607 on the amplifier substrate 680. The substrate bond pads 606, 607, in turn, are coupled to a carrier input lead (e.g., lead 106, 306, FIGS. 1-3) and a peaking input lead (e.g., lead 107, 307, FIGS. 1-3) of the packaged power amplifier device 300.

Now back within the packaged power amplifier device 300, the carrier input lead is coupled to the carrier amplifier path (e.g., path 130, 330, FIGS. 1-3), and the peaking input lead is coupled to the peaking amplifier path (e.g., path 150, 350, FIGS. 1-3). As described previously, the carrier and peaking amplifiers correspond to second stages of the power amplifier 600.

Along the carrier amplifier path, the carrier signal is conveyed from the carrier input lead (e.g., lead 106, 306, FIGS. 1-3) through one or more impedance matching circuits (e.g., circuits 127, 131, 327, 331, FIGS. 1-3) to an input terminal (e.g., terminal 138, 338, FIGS. 1-3) of the carrier amplifier die (e.g., die 132, 332, FIGS. 1-3). Similarly, along the peaking amplifier path, the peaking signal is conveyed from the peaking input lead (e.g., lead 107, 307, FIGS. 1-3) through one or more impedance matching circuits (e.g., circuits 128, 151, 328, 351, FIGS. 1-3) to an input terminal (e.g., terminal 158, 358, FIGS. 1-3) of the peaking amplifier die (e.g., die 152, 352, FIGS. 1-3).

Figure 8:
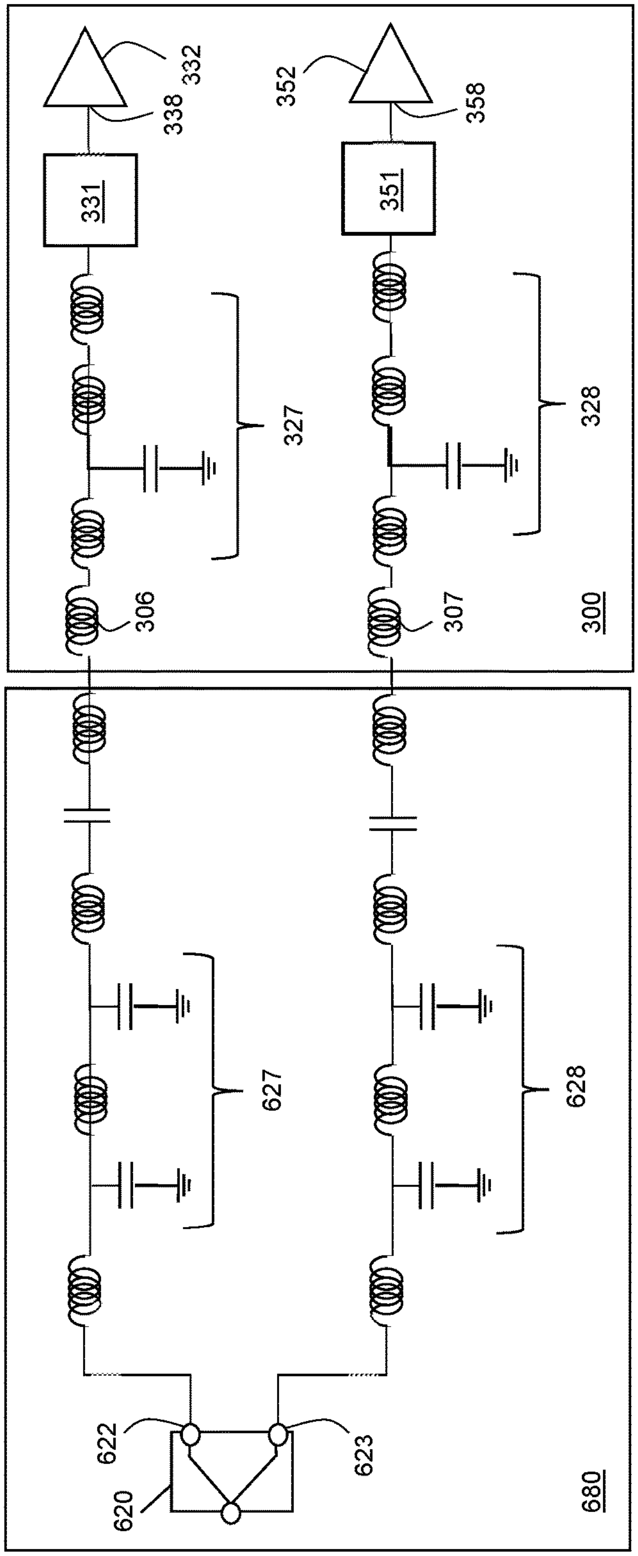
FIG. 8 is a schematic diagram of a portion of a Doherty power amplifier between the splitter outputs and inputs to the carrier and peaking amplifiers, in accordance with an example embodiment.

According to one or more embodiments, the overall impedance matching circuits between the outputs 622, 623 of the power splitter 620 (e.g., outputs 122, 123, of splitter 120, FIGS. 1, 2) to the input terminals of the carrier and peaking amplifier dies (e.g., terminals 138, 158, 338, 358 of dies 132, 152, 332, 352, FIGS. 1-33) are modeled in the schematic diagram of FIG. 8. As described above, the overall impedance matching circuit for the carrier amplifier path includes a first phase shifting circuit 627 (e.g., circuit 127, FIGS. 1, 2) coupled between the first output 622 (e.g., output 122, FIGS. 1, 2) of the power splitter 620 and the carrier input terminal 306 (FIG. 3). As also shown in FIG. 6, this first phase shifting circuit 627 includes two shunt capacitances separated by a series impedance. Impedance matching is further achieved through additional series inductances and a capacitor, along with an inductance (not separately shown) associated with the bond pad 606 to which the carrier input terminal 306 is coupled. At least some of the series coupled inductances may correspond to conductive transmission line segments (schematically represented with inductances in FIG. 8) on the amplifier substrate 680 between the power splitter output 622 and the carrier input terminal 306.

The overall impedance matching circuit for the carrier amplifier path also includes a series inductance associated with the carrier input terminal 306. According to an embodiment, an inductance value for the carrier input terminal 306 may be in a range of about 0.25 nH to about 0.75 nH, although the inductance may be smaller or larger, as well.

Further still, the overall impedance matching circuit for the carrier amplifier path includes first and second carrier input impedance matching circuits 327, 331 (FIG. 3) coupled between the carrier input terminal 306 and the input terminal 338 (FIG. 3) of the carrier amplifier die 332 (FIG. 3). According to an embodiment, and as also shown in FIG. 3, the first carrier input impedance matching circuit 327 includes a plurality of series coupled inductances associated with a series of conductive trace segments between the carrier input terminal 306 and the second carrier input impedance matching circuit 331. In addition, the first carrier input impedance matching circuit 327 may include one or more shunt capacitors and/or other passive components. As discussed previously, the second carrier input impedance matching circuit 331 may include inductances associated with various wirebonds, and inductances and capacitances associated with components integrated on an IPD.

The overall impedance matching circuit for the peaking amplifier path may be substantially similar to the overall impedance matching circuit for the carrier amplifier path. Briefly, and as described above, the overall impedance matching circuit for the peaking amplifier path includes a second phase shifting circuit 628 (e.g., circuit 128, FIGS. 1, 2) coupled between the second output 623 (e.g., output 123, FIGS. 1, 2) of the power splitter 620 and the peaking input terminal 307 (FIG. 3). As also shown in FIG. 6, this second phase shifting circuit 628 includes two shunt capacitances separated by a series impedance. Impedance matching is further achieved through additional series inductances and a capacitor, along with an inductance (not separately shown) associated with the bond pad 607 to which the peaking input terminal 307 is coupled. At least some of the series coupled inductances may correspond to conductive transmission line segments (schematically represented with inductances in FIG. 8) on the amplifier substrate 680 between the power splitter output 623 and the peaking input terminal 307.

The overall impedance matching circuit for the peaking amplifier path also includes a series inductance associated with the peaking input terminal 307. According to an embodiment, an inductance value for the peaking input terminal 307 may be in a range of about 0.25 nH to about 0.75 nH, although the inductance may be smaller or larger, as well.

Further still, the overall impedance matching circuit for the peaking amplifier path includes first and second peaking input impedance matching circuits 328, 351 (FIG. 3) coupled between the peaking input terminal 307 and the input terminal 358 (FIG. 3) of the peaking amplifier die 352 (FIG. 3). According to an embodiment, and as also shown in FIG. 3, the first peaking input impedance matching circuit 328 includes a plurality of series coupled inductances associated with a series of conductive trace segments between the peaking input terminal 307 and the second peaking input impedance matching circuit 351. In addition, the first peaking input impedance matching circuit 328 may include one or more shunt capacitors and/or other passive components. As discussed previously, the second peaking input impedance matching circuit 351 may include inductances associated with various wirebonds, and inductances and capacitances associated with components integrated on an IPD.

Within device 300, the carrier and peaking signals are amplified (by carrier and peaking dies 132, 152, 332, 352, FIGS. 1-3), combined (at combining node 176, 276, 376, FIGS. 1-3), and conveyed through the RF signal output lead (e.g., lead 108, 308, FIGS. 1-3). Referring again to FIG. 6, the RF signal output lead is coupled to bond pad 608, which in turn is coupled to the amplifier output terminal 602 through the output impedance transformer 678 (e.g., output impedance transformer 178, FIGS. 1, 2).

In addition to the various features discussed above, the power amplifier system 600 also may include a plurality of additional terminals 611, 612, 613, 614, 615, 616 on the amplifier substrate 680, which are configured to receive driver amplifier gate and drain bias voltages, carrier amplifier gate and drain bias voltages, and peaking amplifier gate and drain bias voltages, respectively. These terminals 611-616 are coupled through additional traces and bias circuitry on the amplifier substrate 680 to additional substrate bond pads, which in turn are connected to bias terminals (e.g., terminals 109, 304, 305, 309-312, FIGS. 1-3) of the packaged power amplifier device 300.

Figure 9:
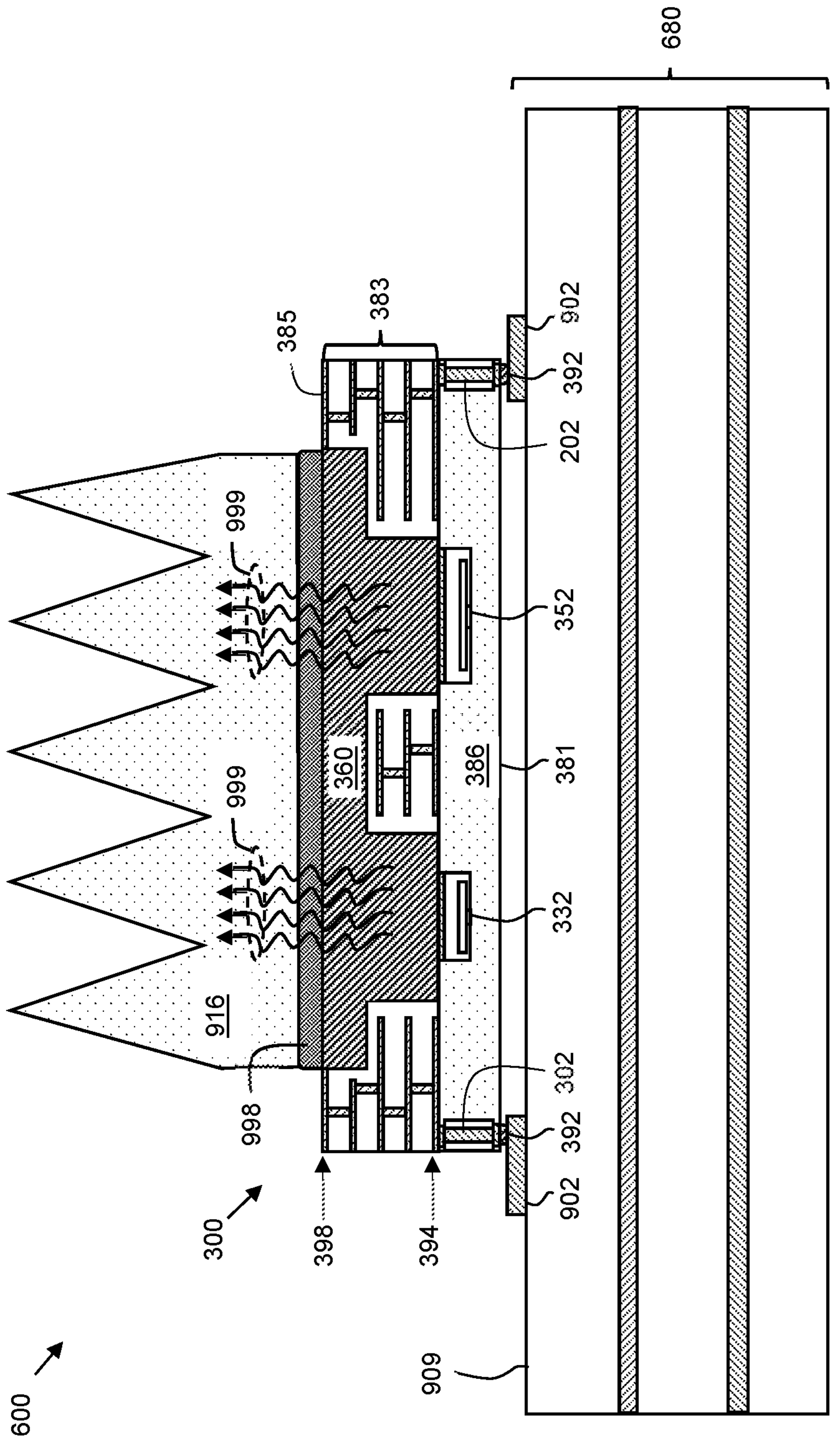
FIG. 9 is a cross-sectional, side view of the power amplifier system of FIG. 6 along line 9-9.

Referring now to FIG. 9, a cross-sectional, side view of the power amplifier system 600 of FIG. 6 along line 9-9 is shown. As mentioned above, and according to one or more embodiments, the packaged power amplifier device 300 may be mounted on the amplifier substrate 680 in an orientation in which the top device surface 381 faces the mounting surface of the amplifier substrate 680 to enable "top side cooling" of the device 300.

In order to connect device 300 to the amplifier substrate 680, each of the terminals 302 of device 300 are aligned and brought into contact with corresponding pads 902 on the mounting surface 909 of the amplifier substrate 680. The conductive attachment material 392 then is reflowed or otherwise cured to physically connect the device terminals 302 to their corresponding pads 902 on the mounting surface 909 of the amplifier substrate 680. In other embodiments, conductive attachment material also or alternatively may be disposed on the conductive pads 902 of the amplifier substrate 680, and an appropriate reflow or curing process may be performed to connect the device 300 to the amplifier substrate 680.

In this orientation, the bottom surface of the heat dissipation structure 360 of the device 300 is facing upward and outward. This enables the heat generated by the dies 314, 332, 352 within the device 300, which is absorbed by the heat dissipation structure 360 (including structures 361, 362), to be removed through the top of the system 600. Again, this is referred to as "top side cooling" the device 300. The top side cooling topology described and illustrated herein may have significant benefits associated with heat dissipation, because this topology allows heat produced by both the driver stage amplifier die (e.g., die 314) and the final stage carrier and peaking amplifier dies (e.g., dies 332, 352) to be removed through the same heat dissipation structure, which may not be possible with a discrete solution in which the driver stage amplifier die is not integrated in the manner described herein and depicted in the figures.

More specifically, a heat sink 916 may be physically and thermally coupled to the upward facing surface of the packaged power amplifier device 300, and specifically to the upward facing surface of the heat dissipation structure 360. The heat sink 916 is formed from a thermally-conductive material, which also may be electrically-conductive. For example, the heat sink 916 may be formed from copper or another bulk conductive material. To couple the heat sink 916 to the packaged power amplifier device 300, a thermally conductive material 998 (e.g., thermal grease) may be dispensed on the exposed surface of the heat dissipation structure 360 (or on the surfaces of heat dissipation structures 361, 362) and/or on the heat sink 916, and the heat sink 916 may be brought into contact with the surface of the heat dissipation structure 360. The heat sink 916 may then be clamped, screwed, or otherwise secured in place.

During operation of the power amplifier system 600, input RF signals are provided through the RF input terminal 601 (FIG. 6) of the amplifier substrate 680 and subsequently through the RF input terminal 304 (FIG. 3) of the packaged power amplifier device 300. The input RF signals are then amplified, as discussed previously. The amplified output RF signals are produced at output terminal 308 (FIG. 3), which is electrically coupled to the RF output terminal 602 on the amplifier substrate 680.

During operation, significant thermal energy (heat) may be produced by the power transistor(s) within the power transistor dies 314, 332, 352. As indicated by arrows 999, the thermal energy produced by the power transistor dies is conveyed through the heat dissipation structure 360 (including structures 361, 362, FIGS. 3-5) to the heat sink 916, which effectively dissipates the heat to the ambient atmosphere. Accordingly, the heat dissipation structure 360 (including structures 361, 362, FIGS. 3-5) conveys heat produced by the power transistor dies 314, 332, 352 to the heat sink 916.

Figure 10:
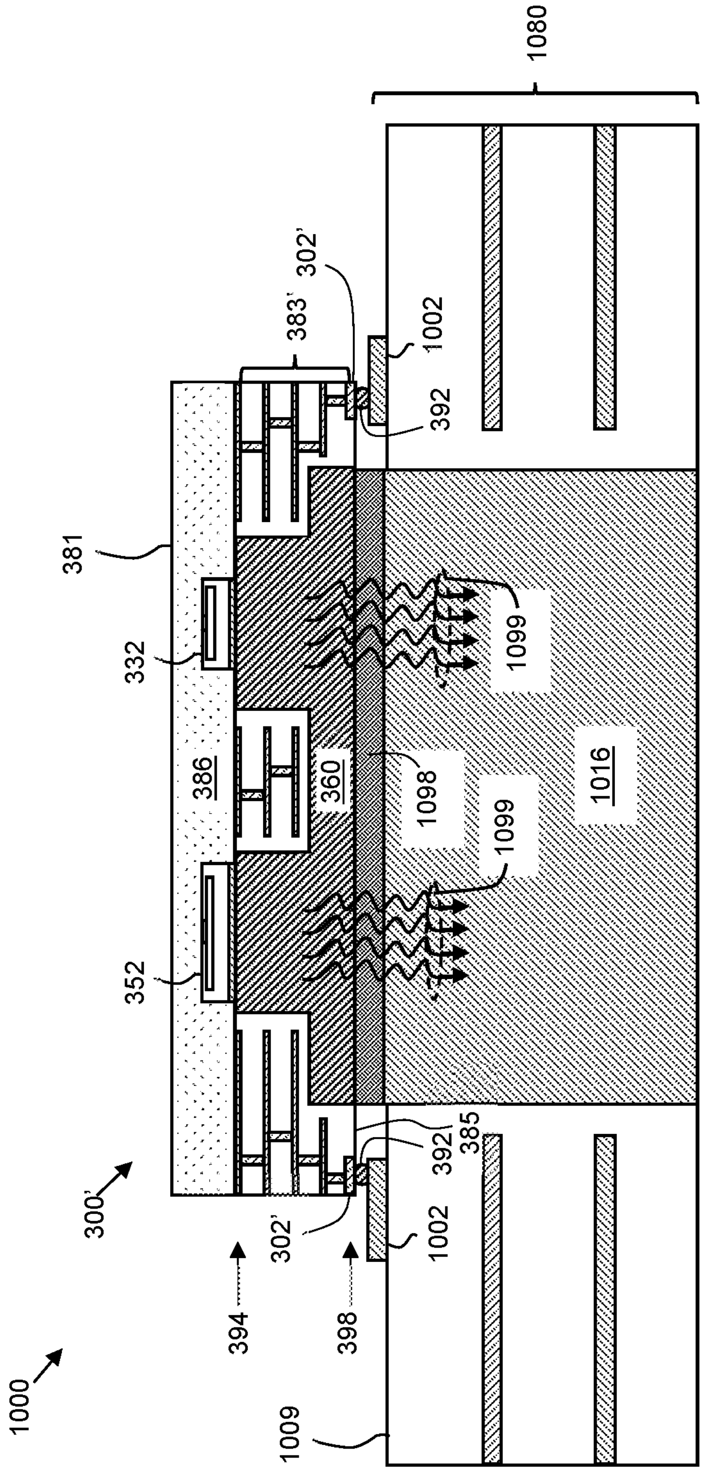
FIG. 10 is a cross-sectional, side view of an amplifier system that includes an alternate embodiment of the power amplifier device of FIG. 3 coupled to a system substrate, in accordance with another example embodiment.

FIG. 10 is a cross-sectional, side view of an amplifier system 1000 that includes an alternate embodiment of the packaged power amplifier device 300 of FIGS. 3-5 coupled to a system substrate 1080 and a heat sink 1016, in accordance with another example embodiment. Specifically, power amplifier 300' differs from power amplifier 300 in that power amplifier 300' does not include leads 302, 304-312 coupled to the mounting surface of the device substrate 383. Instead, the packaged power amplifier device 300' includes RF input, output, and other terminals 302' that are exposed at the bottom surface 385 of a revised device substrate 383'. The RF input and output terminals 302' are electrically coupled through the patterned conductive layers of the device substrate 383' to the power amplifier dies 314, 332, 352 of the device 300'. Other than the configuration of the input, output, and other terminals 302', the other components of the packaged power amplifier device 300' may be substantially identical to the components of the packaged power amplifier device 300, and the details described above in conjunction with FIGS. 3-5 apply equally to device 300'.

The amplifier system 1000 generally includes the amplifier substrate 1080, the packaged power amplifier device 300', and a heat sink 1016. According to an embodiment, the amplifier substrate 1080 includes a multi-layer PCB or other suitable substrate. The amplifier substrate 1080 has a mounting surface 1009, and an opposed bottom surface. The amplifier substrate 1080 also includes a plurality of dielectric layers (e.g., formed from FR-4, ceramic, or other PCB dielectric materials), in an alternating arrangement with a plurality of conductive layers.

The packaged power amplifier device 300' is coupled to the mounting surface 1009 of the amplifier substrate 1080 in the same orientation as the orientation depicted in FIGS. 4 and 5. More specifically, device 300' is coupled to the amplifier substrate 1080 so that the lower surface of the device substrate 383' and the mounting surface 1009 of the amplifier substrate 1080 face each other. In order to connect device 300' to the amplifier substrate 1080, each of the terminals 302' of device 300' are aligned and brought into contact with corresponding pads 1002 on the mounting surface 1009 of the amplifier substrate 1080. The conductive attachment material 392 then is reflowed or otherwise cured to physically connect the device terminals 302' to their corresponding pads 1002 on the mounting surface 1009 of the amplifier substrate 1080. In other embodiments, conductive attachment material also or alternatively may be disposed on the conductive pads 1002 of the amplifier substrate 1080, and an appropriate reflow or curing process may be performed to connect the device 300' to the amplifier substrate 1080.

According to an embodiment, a heat sink 1016 is embedded in the amplifier substrate 1080, and when the device 300' is coupled to the amplifier substrate 1080, the heat sink 1016 is physically and thermally coupled to the bottom surface 385 of the packaged power amplifier device 300', and more specifically to the exposed surface of the embedded heat dissipation structure 360 (including structures 361, 362) of device 300'. The heat sink 1016 is formed from a thermally-conductive material, which also may be electrically-conductive. For example, the heat sink 1016 may be formed from copper or another bulk conductive material. To couple the heat sink 1016 to the packaged power amplifier device 300', a thermally conductive material 1098 (e.g., thermal grease) may be dispensed on the surface of the heat dissipation structure 360 (or the surfaces of structures 361, 362) and/or on the heat sink 1016, and the heat sink 1016 may be brought into contact with the device 300'.

During operation of the power amplifier system 1000, input RF signals are provided through the RF input terminal (not shown) of the amplifier substrate 1080 and subsequently through the RF input terminal (one of terminals 302', not shown) of the packaged power amplifier device 300'. The input RF signals are then amplified, as discussed previously. The amplified output RF signals are produced at an RF output terminal (another one of terminals 302', not shown) of the packaged power amplifier device 300', which is electrically coupled to the RF output terminal (not shown) on the amplifier substrate 1080.

Again, during operation, significant thermal energy (heat) may be produced by the power transistor(s) within the power transistor dies 314, 332, 352. As indicated by arrows 1099, the thermal energy produced by the power transistor dies is conveyed through the heat dissipation structure 360 (including structures 361, 362, FIGS. 3-5) to the heat sink 1016, which effectively dissipates the heat to the bottom of the amplifier substrate 1080, and through an additional heat sink (not shown), ultimately to the ambient atmosphere. Accordingly, the heat dissipation structure 360 (including structures 361, 362, FIGS. 3-5) conveys heat produced by the power transistor dies 314, 332, 352 to the heat sink 1016. This configuration is referred to as "bottom side cooling" the device 300'

An embodiment of a packaged semiconductor device includes a device substrate, an interface for signal communication with an external power splitter, and a first and second stages of a multiple-stage amplifier. The device substrate has a mounting surface and a bottom surface. The interface for signal communication with an external power splitter includes first, second, and third leads coupled to the device substrate. The first stage of the multiple-stage amplifier includes a first amplifier die with a first input, a first output, and a first power transistor that functions as a driver amplifier. The first output is coupled to the first lead. The second stage of the multiple-stage amplifier includes first and second amplifier paths. The first amplifier path has a second amplifier die with a second input, a second output, and a second transistor that functions as a first final stage amplifier. The second input is coupled to the second lead. The second amplifier path has a third amplifier die with a third input, a third output, and a third transistor that functions as a second final stage amplifier. The third input is coupled to the third lead.

An embodiment of a multiple-stage multiple-path power amplifier includes an amplifier substrate, a packaged semiconductor device, and a power splitter. The amplifier substrate has a top substrate surface and first, second, and third device interconnects at a top substrate surface. The packaged semiconductor device is coupled to the top substrate surface, and the packaged semiconductor device includes a device substrate, an interface for signal communication with a power splitter, and first and second stages of a multiple-stage amplifier. The device substrate has a mounting surface and a bottom surface. The interface for signal communication with the power splitter includes first, second, and third leads coupled to the device substrate and coupled to the first, second, and third device interconnects, respectively. The first stage of a multiple-stage amplifier includes a first amplifier die with a first input, a first output, and a first power transistor that functions as a driver amplifier. The first output is coupled to the first lead. The second stage of the multiple-stage amplifier that includes first and second amplifier paths. The first amplifier path has a second amplifier die that has a second input, a second output, and a second transistor that functions as a first final stage amplifier. The second input is coupled to the second lead. The second amplifier path has a third amplifier die with a third input, a third output, and a third transistor that functions as a second final stage amplifier. The third input is coupled to the third lead. The power splitter is coupled to the top substrate surface. The power splitter has a splitter input coupled to the first device interconnect, a first splitter output coupled to the second device interconnect, and a second splitter output coupled to the third device interconnect. The power splitter is configured to receive a first signal characterized by a first signal power at the splitter input, to provide a first portion of the first signal power at the first splitter output, and to provide a second portion of the first signal power at the second splitter output.

The preceding detailed description is merely illustrative in nature and is not intended to limit the embodiments of the subject matter or the application and uses of such embodiments. As used herein, the word “exemplary” means “serving as an example, instance, or illustration.” Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms “first”, “second” and other such numerical terms referring to structures do not imply a sequence or order unless clearly indicated by the context.

As used herein, a “node” means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being “connected” or “coupled” together. As used herein, unless expressly stated otherwise, “connected” means that one element is directly joined to (or directly communicates with) another element, and not necessarily mechanically. Likewise, unless expressly stated otherwise, “coupled” means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A packaged semiconductor device comprising:
- a device substrate with a mounting surface and a bottom surface;
- an interface for signal communication with an external power splitter, wherein the interface includes first, second, and third leads coupled to the device substrate;
- a first stage of a multiple-stage amplifier that includes a first amplifier die with a first input, a first output, and a first power transistor that functions as a driver amplifier, wherein the first output is coupled to the first lead; and
- a second stage of a multiple-stage amplifier that includes
  - a first amplifier path with a second amplifier die that has a second input, a second output, and a second transistor that functions as a first final stage amplifier, wherein the second input is coupled to the second lead, and
  - a second amplifier path with a third amplifier die that has a third input, a third output, and a third transistor that functions as a second final stage amplifier, wherein the third input is coupled to the third lead.

2. The packaged semiconductor device of claim 1, further comprising:
- a first heat dissipation structure extending between the mounting and bottom surfaces of the device substrate, wherein a first surface of the first heat dissipation structure is exposed at the mounting surface of the device substrate, and the second amplifier die is coupled to the first surface of the first heat dissipation structure; and
- a second heat dissipation structure extending between the mounting and bottom surfaces of the device substrate, wherein a first surface of the second heat dissipation structure is exposed at the mounting surface of the device substrate, and the third amplifier die is coupled to the first surface of the second heat dissipation structure.

3. The packaged semiconductor device of claim 2, wherein:
- the first amplifier die also is coupled to the first surface of the second heat dissipation structure.

4. The packaged semiconductor device of claim 1, wherein:
- the first lead is characterized by a first inductance that forms a portion of a first impedance transformation circuit;

the second lead is characterized by a second inductance that forms a portion of a second impedance transformation circuit; and the third lead is characterized by a third inductance that forms a portion of a third impedance transformation circuit.

5. The packaged semiconductor device of claim 4, wherein the first, second, and third inductances are in a range of 0.25 nanohenries to 0.75 nanohenries.

6. The packaged semiconductor device of claim 1, wherein:

the first, second, and third leads have proximal ends coupled to the mounting surface of the device substrate, and the first, second, and third leads extend perpendicularly from the mounting surface to distal ends of the first, second, and third leads.

7. The packaged semiconductor device of claim 6, further comprising:

nonconductive encapsulant over the mounting surface of the device substrate, wherein the nonconductive encapsulant covers the first, second, and third amplifier dies, wherein an upper surface of the nonconductive encapsulant at least partially defines a contact surface of the packaged semiconductor device, and wherein the distal ends of the first, second, and third leads are exposed at the contact surface of the packaged semiconductor device.

8. The packaged semiconductor device of claim 1, further comprising:

a fourth lead coupled to the device substrate and coupled to the first input of the first amplifier die.

9. The packaged semiconductor device of claim 8, further comprising:

at least a portion of a first-stage input impedance matching circuit coupled between the fourth lead and the first input of the first amplifier die; and at least a portion of a first-stage output impedance matching circuit coupled between the first output of the first amplifier die and the first lead.

10. The packaged semiconductor device of claim 1, further comprising:

at least a portion of a first final-stage input impedance matching circuit coupled between the second lead and the second input of the second amplifier die; and at least a portion of a second final-stage input impedance matching circuit coupled between the third lead and the third input of the third amplifier die.

11. The packaged semiconductor device of claim 1, wherein:

the multiple-stage amplifier is a Doherty power amplifier, the first amplifier die is a driver amplifier die;

the second amplifier die is a carrier amplifier die; and the third amplifier die is a peaking amplifier die.

12. The packaged semiconductor device of claim 11, wherein the packaged semiconductor device further comprises:

a fourth lead coupled to the device substrate; and an output combining network with a first transmission line with a proximal end and a distal end, wherein the proximal end is coupled to the second output of the second amplifier die, and a combining node coupled to the third output of the third amplifier die, to the distal end of the first transmission line, and to the fourth lead.

13. The packaged semiconductor device of claim 12, wherein the output combining network further comprises:

a second transmission line coupled between the combining node and the third output of the third amplifier die.

14. The packaged semiconductor device of claim 1, wherein the first, second, and third leads are selected from conductive pillars, Quad Flat No-Lead (QFN) package leads, gull wing leads, Land Grid Array (LGA) package leads, and Ball Grid Array (BGA) package leads.

15. A multiple-stage multiple-path power amplifier comprising:

an amplifier substrate having a top substrate surface and first, second, and third device interconnects at the top substrate surface;

a packaged semiconductor device coupled to the top substrate surface, wherein the packaged semiconductor device includes a device substrate with a mounting surface and a bottom surface, an interface for signal communication with a power splitter, wherein the interface includes first, second, and third leads coupled to the device substrate and coupled to the first, second, and third device interconnects, respectively, a first stage of a multiple-stage amplifier that includes a first amplifier die with a first input, a first output, and a first power transistor that functions as a driver amplifier, wherein the first output is coupled to the first lead, and a second stage of a multiple-stage amplifier that includes a first amplifier path with a second amplifier die that has a second input, a second output, and a second transistor that functions as a first final stage amplifier, wherein the second input is coupled to the second lead, and a second amplifier path with a third amplifier die that has a third input, a third output, and a third transistor that functions as a second final stage amplifier, wherein the third input is coupled to the third lead; and the power splitter coupled to the top substrate surface, wherein the power splitter has a splitter input coupled to the first device interconnect, a first splitter output coupled to the second device interconnect, and a second splitter output coupled to the third device interconnect, and wherein the power splitter is configured to receive a first signal characterized by a first signal power at the splitter input, to provide a first portion of the first signal power at the first splitter output, and to provide a second portion of the first signal power at the second splitter output.

16. The multiple-stage multiple-path power amplifier of claim 15, wherein:

the multiple-stage multiple-path power amplifier is a Doherty power amplifier, the first amplifier die is a driver amplifier die;

the second amplifier die is a carrier amplifier die; and the third amplifier die is a peaking amplifier die.

17. The multiple-stage multiple-path power amplifier of claim 15, wherein the packaged semiconductor device further comprises:

a first heat dissipation structure extending between the mounting and bottom surfaces of the device substrate, wherein a first surface of the first heat dissipation structure is exposed at the mounting surface of the device substrate, and the second amplifier die is coupled to the first surface of the first heat dissipation structure; and a second heat dissipation structure extending between the mounting and bottom surfaces of the device substrate, wherein a first surface of the second heat dissipation structure is exposed at the mounting surface of the device substrate, and the first and third amplifier dies are coupled to the first surface of the second heat dissipation structure.

18. The multiple-stage multiple-path power amplifier of claim 17, wherein the packaged semiconductor device further comprises:

a fourth lead coupled to the device substrate; and an output combining network with a first transmission line with a proximal end and a distal end, wherein the proximal end is coupled to the second output of the second amplifier die, and a combining node coupled to the third output of the third amplifier die, to the distal end of the first transmission line, and to the fourth lead.

19. The multiple-stage multiple-path power amplifier of claim 18, wherein the output combining network further comprises:

a second transmission line coupled between the combining node and the third output of the third amplifier die.

* * * * *